(12) United States Patent
Matsuda

(10) Patent No.: US 11,393,837 B2
(45) Date of Patent: Jul. 19, 2022

(54) SEMICONDUCTOR MEMORY DEVICE AND METHOD OF MANUFACTURING THE SAME

(71) Applicant: Kioxia Corporation, Minato-ku (JP)

(72) Inventor: Toru Matsuda, Yokkaichi (JP)

(73) Assignee: Kioxia Corporation, Minato-ku (JP)

( * ) Notice: Subject to any disclaimer, the term of this patent is extended or adjusted under 35 U.S.C. 154(b) by 61 days.

(21) Appl. No.: 16/810,930

(22) Filed: Mar. 6, 2020

(65) Prior Publication Data

US 2021/0082939 A1 Mar. 18, 2021

(30) Foreign Application Priority Data

Sep. 12, 2019 (JP) .............................. JP2019-166314

(51) Int. Cl.
| | |
|---|---|
| *H01L 27/11582* | (2017.01) |
| *H01L 27/11565* | (2017.01) |
| *H01L 27/11524* | (2017.01) |
| *H01L 27/11519* | (2017.01) |
| *H01L 27/1157* | (2017.01) |
| *H01L 27/11556* | (2017.01) |

(52) U.S. Cl.
CPC .... *H01L 27/11565* (2013.01); *H01L 27/1157* (2013.01); *H01L 27/11519* (2013.01); *H01L 27/11524* (2013.01); *H01L 27/11556* (2013.01); *H01L 27/11582* (2013.01)

(58) Field of Classification Search
CPC ...................... H01L 27/11578; H01L 27/11582
See application file for complete search history.

(56) References Cited

U.S. PATENT DOCUMENTS

2017/0179154 A1    6/2017  Furihata et al.
2019/0067314 A1 *  2/2019  Lu ..................... H01L 27/11565

* cited by examiner

*Primary Examiner* — Christopher A Johnson
(74) *Attorney, Agent, or Firm* — Oblon, McClelland, Maier & Neustadt, L.L.P.

(57) ABSTRACT

A first region includes a memory cell transistor. A second region is adjacent to the first region in a first direction, and includes first and second subregions aligned in a second direction. First members include a portion extending along the first direction, and are provided in the first subregion. The first members are arranged in such a manner that the first members aligned in the second direction in an n-th row and an (n+1)-th row, counted from a side of the second subregion, are shifted in the first direction. The first members adjacent to each other in the second direction are arranged in such a manner that portions extending in the first direction face each other.

16 Claims, 20 Drawing Sheets

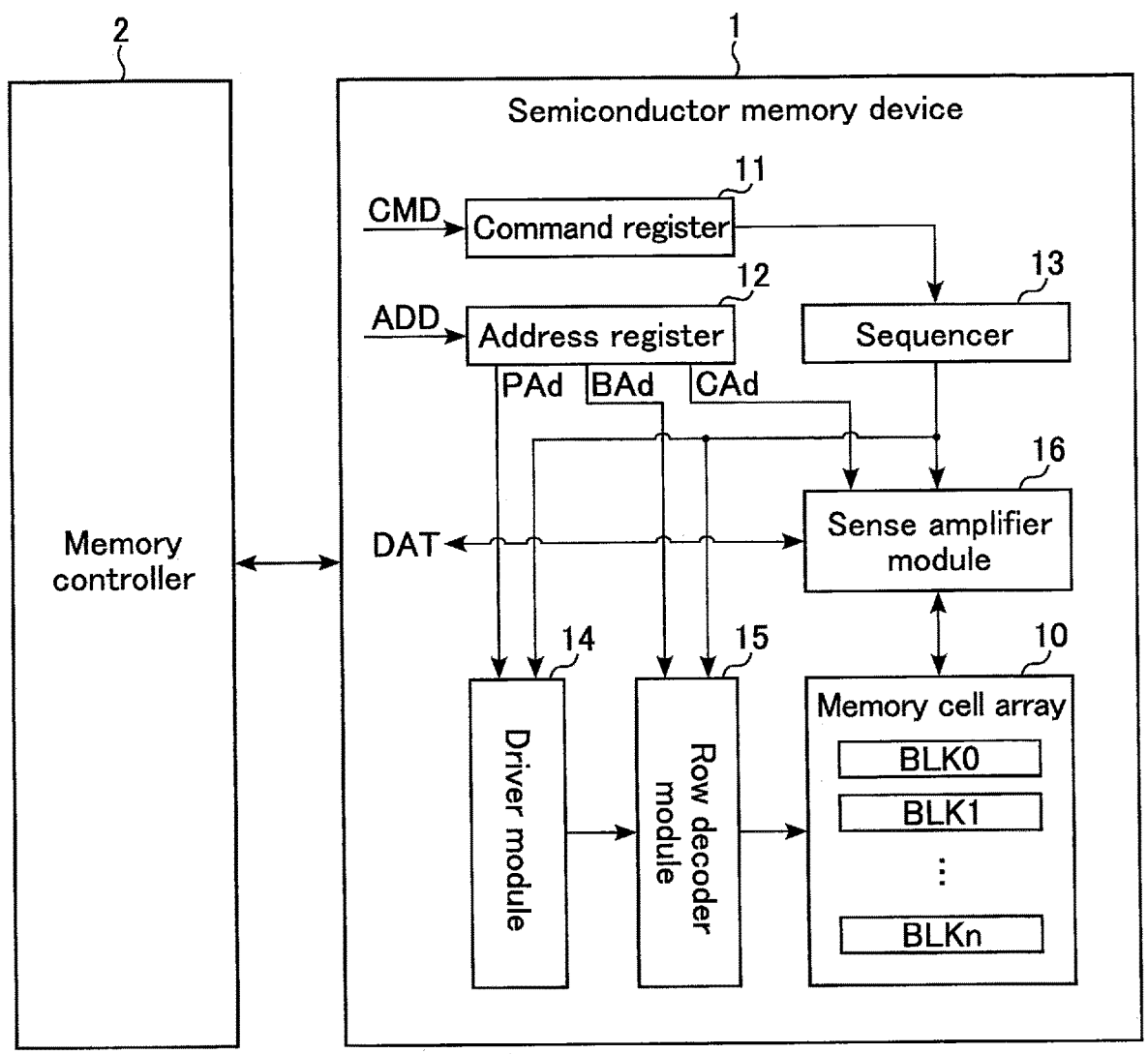
F I G. 1

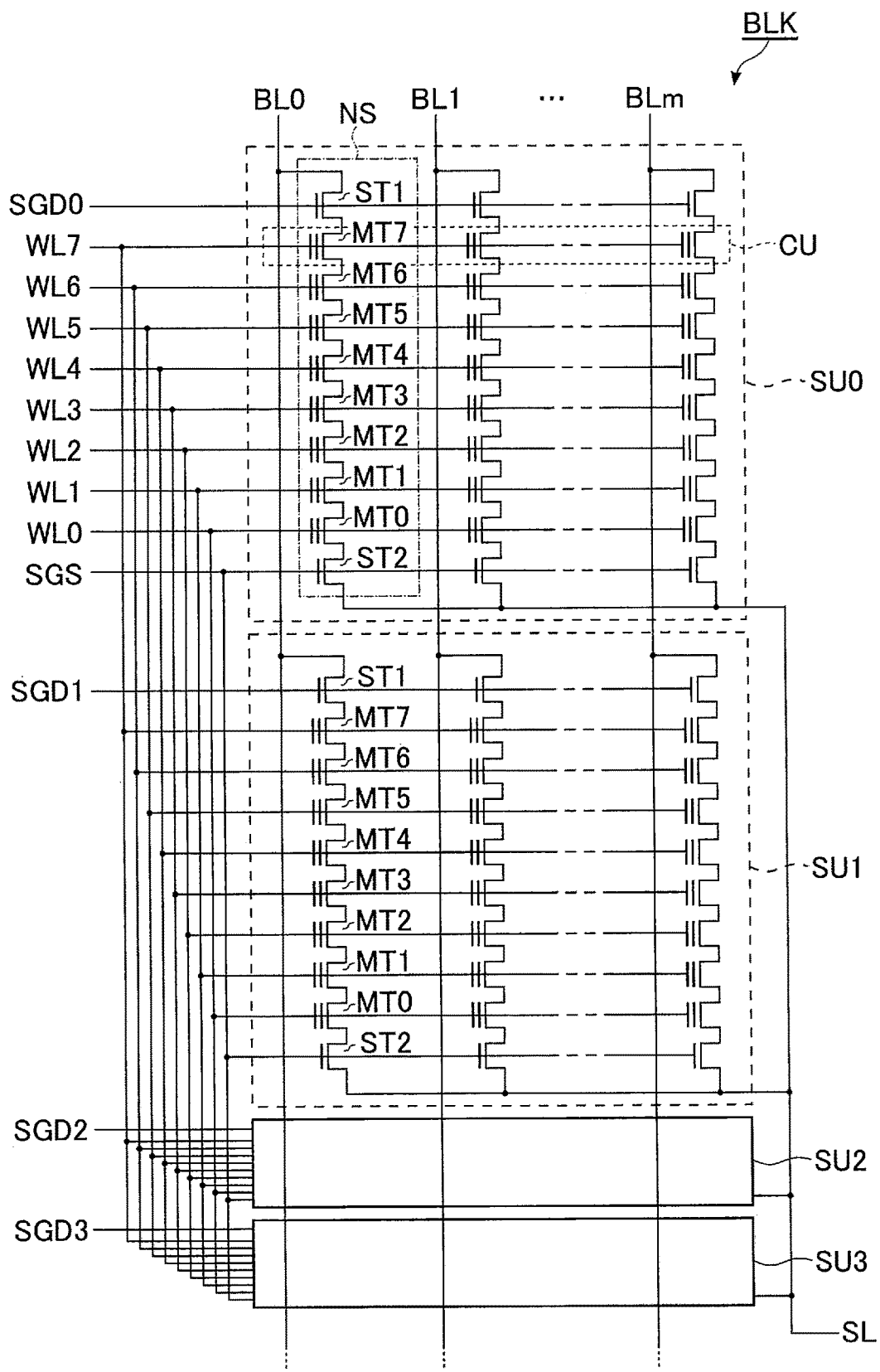
F I G. 2

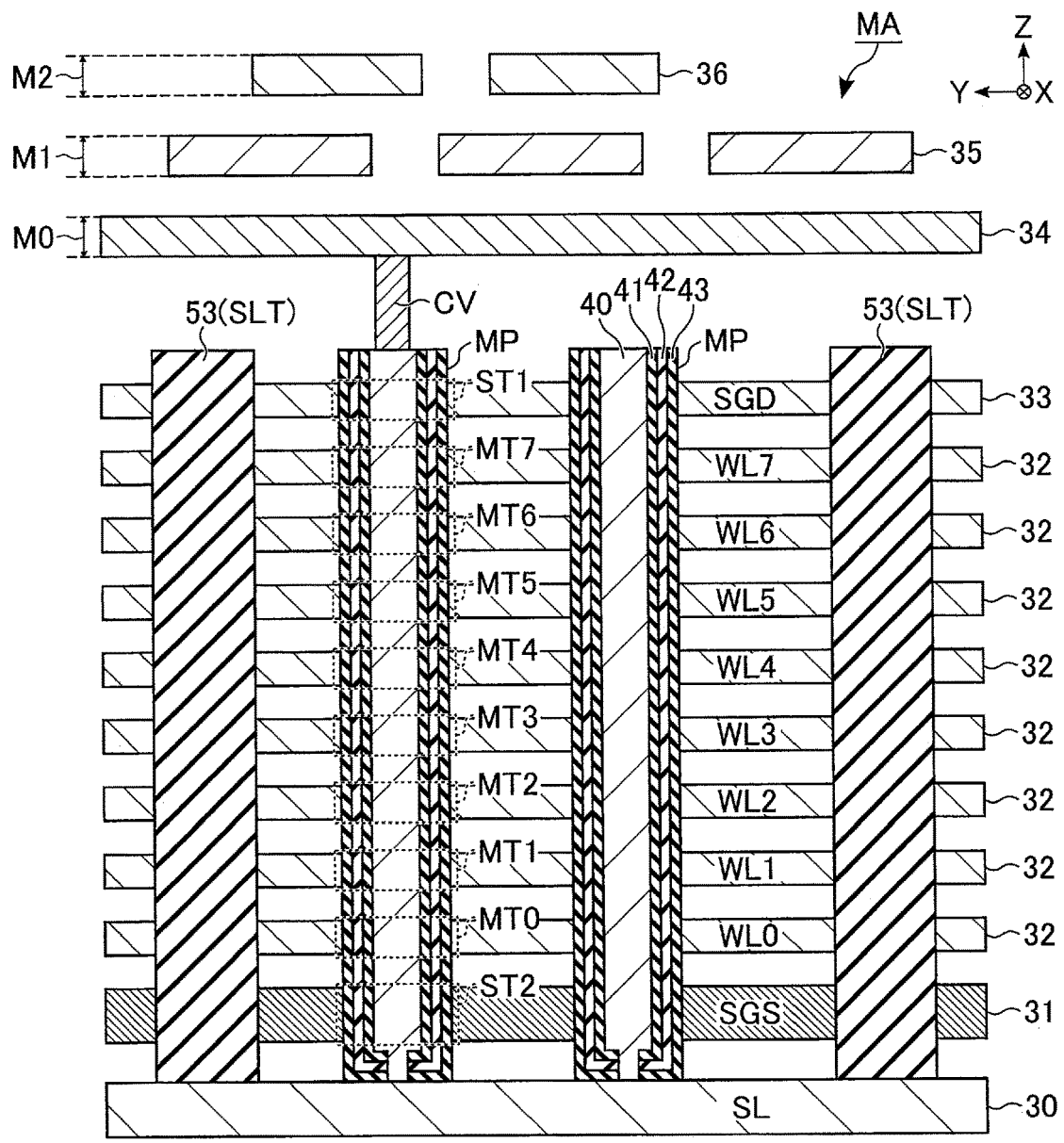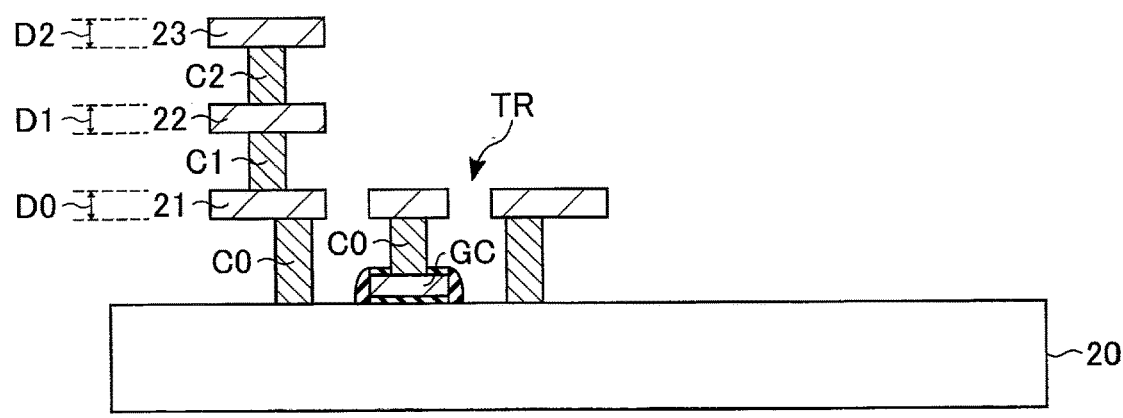
F I G. 4

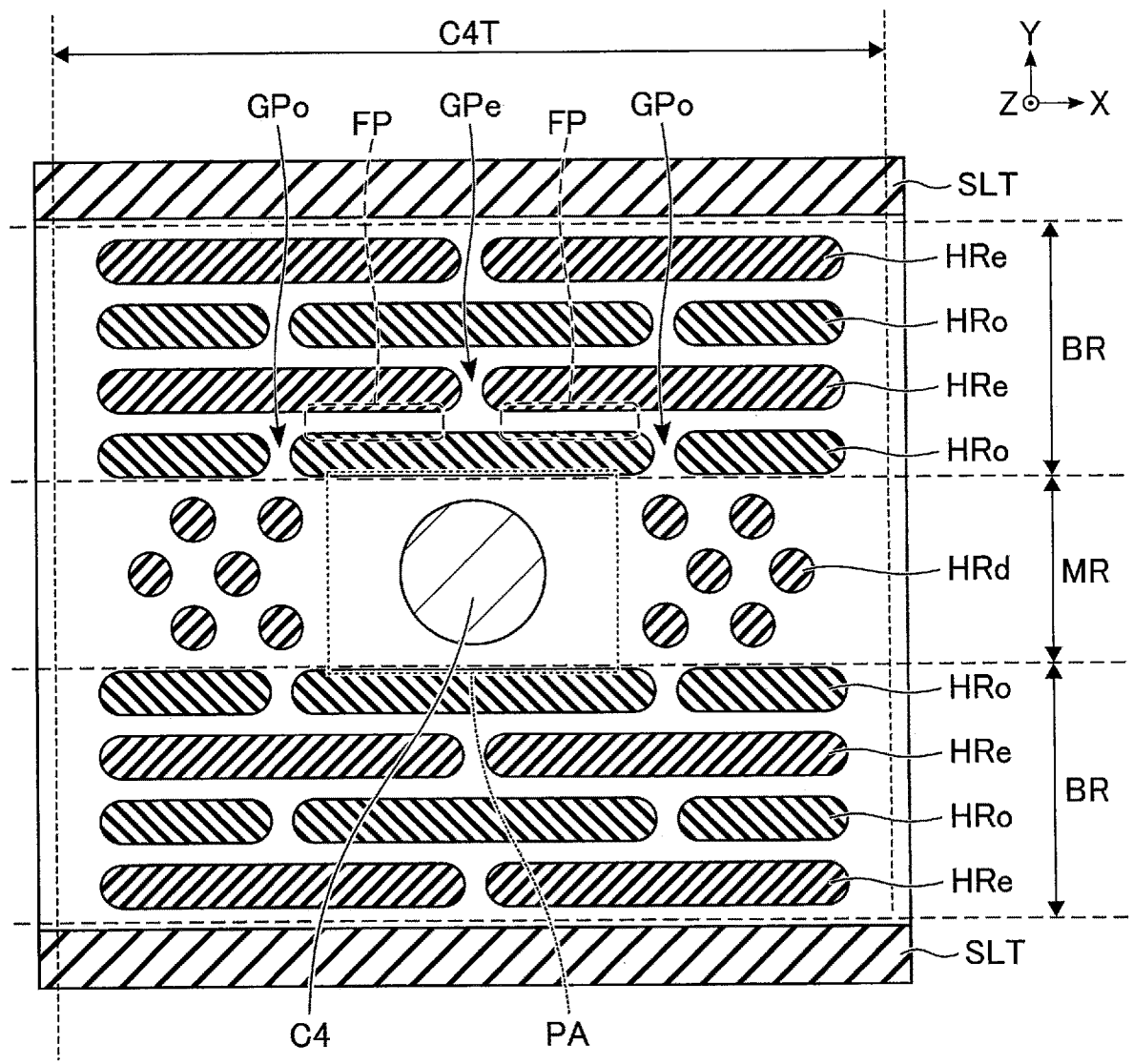
F I G. 7

SEMICONDUCTOR MEMORY DEVICE AND METHOD OF MANUFACTURING THE SAME

CROSS-REFERENCE TO RELATED APPLICATIONS

This application is based upon and claims the benefit of priority from Japanese Patent Application No. 2019-166314, filed Sep. 12, 2019, the entire contents of which are incorporated herein by reference.

FIELD

Embodiments described herein relate generally to a semiconductor memory device, and a method of manufacturing the same.

BACKGROUND

A NAND flash memory, capable of storing data in a non-volatile manner, is known.

BRIEF DESCRIPTION OF THE DRAWINGS

FIG. 1 is a block diagram showing a configuration example of a semiconductor memory device according to an embodiment.

FIG. 2 is a circuit diagram showing an example of a circuit configuration of a memory cell array included in the semiconductor memory device according to the embodiment.

FIG. 4 is a cross-sectional view illustrating an example of a cross-sectional structure of the memory cell array included in the semiconductor memory device according to the embodiment.

FIG. 7 is a planar view showing an example of a planar layout of the memory cell array included in the semiconductor memory device according to the embodiment.

DETAILED DESCRIPTION

Figure 3:
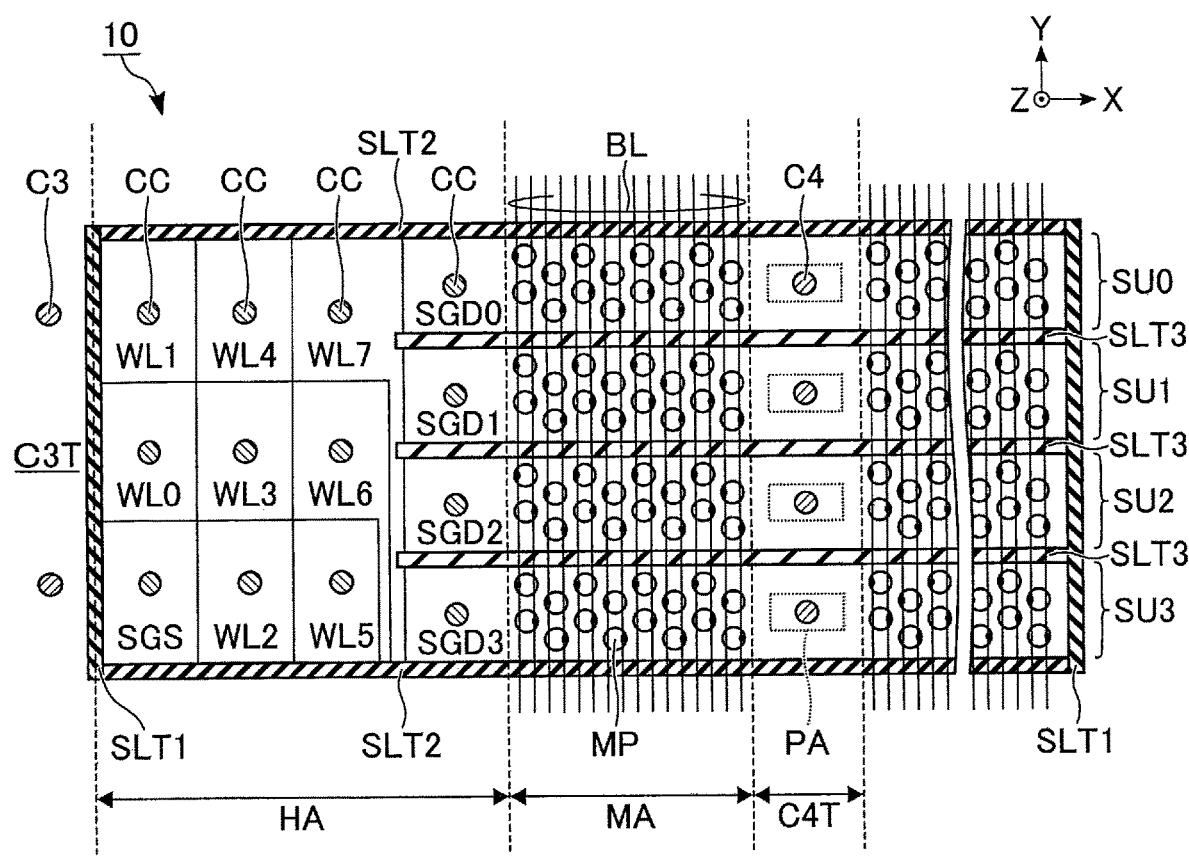
FIG. 3 is a planar view showing an example of a planar layout of the memory cell array included in the semiconductor memory device according to the embodiment.

A semiconductor memory device includes a substrate, a first insulating member, a second insulating member, a first conductive layer, a plurality of first pillars, a first insulating layer, a first contact, a plurality of first members, and a plurality of second members. The substrate includes a first region and a second region. The first region includes a memory cell transistor. The second region is adjacent to the first region in a first direction. The second region includes first to third subregions aligned in a second direction intersecting the first direction.

Each of the first insulating member and the second insulating member is provided across the first region and the second region along the first direction, and includes a portion that interposes the first to third subregions in the second direction.

The first conductive layer is provided in a first layer above the substrate so as to extend along the first direction across the first region and the second region between the first insulating member and the second insulating member.

The plurality of first pillars are provided in the first region so as to penetrate the first conductive layer.

The first insulating layer is provided in the first layer in the second subregion, and surrounded by a portion of the first conductive layer that extends in the first layer across the second region.

The first contact is provided so as to penetrate the first insulating layer.

Each of the plurality of first members includes a portion extending along the first direction, and is provided so as to penetrate the first conductive layer in the first subregion. Each of the plurality of second members includes a portion extending along the first direction, and is provided so as to penetrate the first conductive layer in the third subregion.

Both the first members and the second members are arranged in such a manner that the first members and the second members aligned in the second direction in an n-th row and an (n+1)-th row, counted from a side of the second subregion, are shifted in the first direction, where n is an integer not less than one.

Both the first members adjacent to each other in the second direction and the second members adjacent to each other in the second direction are arranged in such a manner that portions extending in the first direction face each other.

Hereinafter, embodiments will be described with reference to the accompanying drawings. Each of the embodiments describes, as an example, a device or method for embodying the technical idea of the embodiment. The drawings are schematic or conceptual, and the dimensions, ratios, etc. in the drawings are not always the same as the actual ones. The entire description of an embodiment is applicable to another embodiment, unless otherwise expressly or self-evidently stated. The technical idea of the present embodiments is not specified by the shapes, configurations, arrangements, etc. of the structural components.

In the following description, structural components having substantially the same function and configuration will be denoted by the same reference symbol. A numeral following letters constituting a reference symbol is used to distinguish between components referred to by reference symbols including the same letters and having the same configuration. If components represented by reference symbols including the same letters need not be distinguished, such components are assigned reference symbols including only the same letters.

[1] Embodiment

[1-1] Configuration of Semiconductor Memory Device 1

Hereinafter, a semiconductor memory device 1 according to an embodiment will be described.

[1-1-1] Overall Configuration of Semiconductor Memory Device 1

FIG. 1 shows a configuration example of a semiconductor memory device 1 according to an embodiment. The semiconductor memory device 1 is a NAND flash memory, capable of storing data in a non-volatile manner. The semiconductor memory device 1 is controlled by, for example, an external memory controller 2.

As shown in FIG. 1, the semiconductor memory device 1 includes, for example, a memory cell array 10, a command register 11, an address register 12, a sequencer 13, a driver module 14, a row decoder module 15, and a sense amplifier module 16.

The memory cell array 10 includes a plurality of blocks BLK0 to BLKn (where n is an integer not less than 1). Each block BLK includes a set of memory cell transistors MT (not illustrated) capable of storing data in a non-volatile manner, and is used as, for example, a unit of data erasure. A source line SL, word lines WL, and bit lines BL (not illustrated) are coupled to the memory cell array 10. Each memory cell transistor is associated with, for example, a single bit line BL and a single word line WL. A detailed configuration of the memory cell array 10 will be described later.

The command register 11 holds a command CMD received by the semiconductor memory device 1 from the memory controller 2. The command CMD includes an instruction to cause the sequencer 13 to perform, for example, a read operation, a write operation, an erase operation, etc.

The address register 12 holds address information ADD received by the semiconductor memory device 1 from the memory controller 2. The address information ADD includes, for example, a block address BAd, a page address PAd, and a column address CAd. The block address BAd, the page address PAd, and the column address CAd are used to respectively select, for example, a block BLK, a word line WL, and a bit line BL.

The sequencer 13 controls the entire operation of the semiconductor memory device 1. For example, the sequencer 13 controls the driver module 14, the row decoder module 15, and the sense amplifier module 16, etc., based on the command CMD held in the command register 11, to perform a read operation, a write operation, an erase operation, etc.

The driver module 14 generates a voltage to be used in a read operation, a write operation, an erase operation, etc., and supplies the generated voltage to the row decoder module 15. Based on, for example, the page address PAd held in the address register 12, the driver module 14 applies the generated voltage to a signal line corresponding to a selected word line WL.

Based on the block address BAd held in the address register 12, the row decoder module 15 selects a single corresponding block BLK in the memory cell array 10. Thereafter, the row decoder module 15 transfers, for example, the voltage applied to the signal line corresponding to the selected word line WL to the selected word line WL in the selected block BLK.

In a write operation, the sense amplifier module 16 applies, to each bit line BL, a voltage determined in accordance with write data DAT received from the memory controller 2. In a read operation, the sense amplifier module 16 determines data stored in a memory cell transistor MT based on the voltage of the bit line BL, and transfers the result of the determination to the memory controller 2 as read data DAT.

The above-described semiconductor memory device 1 and the memory controller 2 in combination may constitute a single semiconductor memory device. Examples of such a semiconductor memory device include a memory card such as an SD™ card, a solid state drive (SSD), etc.

[1-1-2] Circuit Configuration of Memory Cell Array 10

FIG. 2 shows an example of a circuit configuration of the memory cell array 10 included in the semiconductor memory device 1 according to the embodiment, in which one of a plurality of blocks BLK included in the memory cell array 10 is shown. All the other blocks BLK are configured of the same components and connections as those shown in FIG. 2. The number of blocks BLK in the memory cell array 10 and the number of string units SU in each block BLK may be set to any number. In the description given below, let us assume, as an example, that a block BLK includes four string units SU0 to SU3.

Each string unit SU is a set of NAND strings NS that are respectively associated with bit lines BL0 to BLm (where m is an integer not less than 1). Each NAND string NS includes, for example, memory cell transistors MT0 to MT7 and select transistors ST1 and ST2. Each memory cell transistor MT includes a control gate and a charge storage layer, and stores data in a non-volatile manner. Each of the select transistors ST1 and ST2 is used to select a string unit SU in various operations.

In each NAND string NS, memory cell transistors MT0 to MT7 are coupled in series. A drain of the select transistor ST1 is coupled to a corresponding bit line BL, and a source of the select transistor ST1 is coupled to one end of a set of memory cell transistors MT0 to MT7 coupled in series. A drain of the select transistor ST2 is coupled to the other end of the set of memory cell transistors MT0 to MT7 coupled in series. A source of the select transistor ST2 is coupled to the source line SL.

Control gates of sets of memory cell transistors MT0 to MT7 in the same block BLK are respectively coupled in common to the word lines WL0 to WL7. Gates of the select transistors ST1 in the string units SU0 to SU3 are respectively coupled in common to the select gate lines SGD0 to SGD3. Gates of the select transistors ST2 are coupled in common to the select gate line SGS.

One of the NAND strings NS in each string unit SU is coupled to a corresponding bit line BL. The source line SL is shared among, for example, a plurality of blocks BLK.

A set of memory cell transistors MT coupled to a common word line WL in a single string unit SU is referred to as, for example, a cell unit CU. For example, the storage capacity of a cell unit CU including memory cell transistors MT, which individually store 1-bit data, is defined as "1-page data". A cell unit CU may have a storage capacity of 2 or more pages of data, according to the number of bits of data stored in the memory cell transistor MT.

The circuit configuration of the memory cell array 10 included in the semiconductor memory device 1 according to the embodiment is not limited to the above-described one. For example, the numbers of memory cell transistors MT and select transistors ST1 and ST2 included in each NAND string NS may be designed to be any number.

[1-1-3] Structure of Memory Cell Array 10

Hereinafter, an example of a structure of the memory cell array 10 according to the embodiment will be described. In the drawings that will be referred to hereinafter, "Y direction" corresponds to the direction in which the bit lines BL extend, "X direction" corresponds to the direction in which the word lines WL extend, and "Z direction" corresponds to the direction vertical to the surface of the semiconductor substrate 20 (not illustrated), on which the semiconductor memory device 1 is formed. In the planar views, hatching is applied, where necessary, for improved visibility. The hatching applied in the planar views does not necessarily relate to the material or characteristics of the hatched components. In the cross-sectional views, structural components such as insulating layers (interlayer insulating films), interconnects, contacts, etc. are omitted, where not necessary, for improved visibility.

(Planar Layout of Memory Cell Array 10)

FIG. 3 shows an example of a planar layout of the memory cell array 10 of the semiconductor memory device 1 according to the embodiment, in which a region corresponding to a single block BLK (i.e., string units SU0 to SU3) is shown. As shown in FIG. 3, the memory cell array 10 includes, for example, a memory region MA, a hookup region HA, and contact regions C3T and C4T. The memory cell array 10 further includes a plurality of slits SLT1 to SLT3, a plurality of memory pillars MP, and a plurality of contacts CC, C3 and C4.

The memory region MA, the hookup region HA, and the contact regions C3T and C4T are provided so as to extend in the Y direction, and are aligned along the X direction. The memory region MA occupies the majority of the memory cell array 10. The hookup region HA is provided at one end of a stacked structure of the memory cell array 10 in the X direction. The contact region C4T is suitably inserted in the memory cell array 10, and divides, for example, the memory region MA in the X direction. In other words, the contact region C4T is provided between two memory regions MA adjacent to each other in the X direction. The contact region C3T is provided outside the stacked structure of the memory cell array 10. Alternatively, the hookup region HA may be provided at both ends as viewed in the X direction, and the contact region C4T may be inserted in the hookup region HA.

In the hookup region HA, each of the select gate line SGS, the word lines WL0 to WL7, and the select gate lines SGD includes a portion (terrace portion) that does not overlap the upper interconnect layers (conductive layer). The portion that does not overlap the upper interconnect layers is in a shape similar to the shape of a staircase, a terrace, rimstone, etc. Specifically, steps are individually provided between the select gate line SGS and the word line WL0, between the word line WL0 and the word line WL1, . . . , between the word line WL6 and the word line WL7, and between the word line WL7 and the select gate line SGD.

Each of the slits SLT1 to SLT3 has a structure in which an insulating member is embedded inside, and divides conductive layers provided in the same interconnect layer so as to be adjacent to each other, with the slit SLT interposed therebetween. The slits SLT1 are provided so as to extend along the Y direction, and are aligned in the X direction. The slits SLT2 are provided so as to extend along the X direction, and connect adjacent slits SLT1. That is, a set of adjacent slits SLT1 and adjacent slits SLT2 form an annular region. Three slits SLT3, for example, are provided between the adjacent slits SLT1. The three slits SLT3 are provided so as to extend along the X direction, and are aligned in the Y direction. The four regions separated by the slits SLT2 and SLT3 in the region surrounded by the slits SLT1 and SLT2 respectively correspond to the select gate lines SGD0 to SGD3.

The memory pillars MP, each of which functions as, for example, a single NAND string NS, are included in the memory region MA. The memory pillars MP are in, for example, a four-row staggered arrangement in a region between adjacent slits SLT2 and SLT3, and between two adjacent slits SLT3. However, the number and arrangement of the memory pillars MP between adjacent slits SLT2 and SLT3, or between two adjacent slits SLT3 are not limited thereto, and may be suitably varied.

At least one bit line BL overlaps each of the memory pillars MP. The bit lines BL extend in the Y direction, and are aligned in the X direction. In the present example, two bit lines BL are arranged so as to overlap each memory pillar MP, and electrical coupling is provided between the memory pillar MP and one of the bit lines BL overlapping the memory pillar MP.

In the hookup region HA, the contacts CC are arranged in the respective terrace portions of the select gate line SGS, the word lines WL0 to WL7, and the select gate lines SGD. The contacts C3 are included in the contact region C3T, and are coupled to, for example, the contacts CC associated therewith. The select gate line SGS, the word lines WL0 to WL7, and the select gate lines SGD are electrically coupled to the row decoder module 15 via the contacts CC and C3 coupled thereto. In this manner, the hookup region HA and the contact region C3T are used for coupling between the row decoder module 15 and the stacked interconnects (e.g., the word lines WL and the select gate lines SGS and SGD) coupled to the NAND string NS.

The contacts C4, which penetrate the region in which the memory cell array 10 is formed, are used to supply power to, for example, a circuit provided below the memory cell array 10. The contacts C4 are provided in a penetration region PA in the contact region C4T. The penetration region PA will be discussed in detail later. The number of contacts C4 provided in the penetration region PA may be two or greater.

In the planar layout of the memory cell array 10 of the semiconductor memory device 1 described above, each of the regions separated by the slits SLT2 and SLT3 functions as a single string unit SU. That is, string units SU0 to SU3, each extending in the X direction, are aligned in the Y direction. In the memory cell array 10, the layout corresponding to a single block BLK shown in FIG. 3, for example, is repeatedly arranged in the Y direction. A single memory pillar MP is electrically coupled to a single bit line BL in each space separated by the slits SLT1 to SLT3.

(Structure of Memory Cell Array 10 in Memory Region MA)

FIG. 4 illustrates an example of a cross-sectional structure of the memory region MA of the memory cell array 10 in the semiconductor memory device 1 according to the embodiment. As shown in FIG. 4, the semiconductor memory device 1 includes, in the memory region MA, conductive layers GC, conductive layers 21 to 23, and 30 to 36, memory pillars MP, contacts C0 to C2 and CV, and an insulating member 53.

The conductive layer GC is provided above the semiconductor substrate 20, with a gate insulating film interposed therebetween. The conductive layer GC functions as a gate electrode of a transistor TR provided below the memory cell array 10. The contacts C0 are provided on the conductive layer GC and on the semiconductor substrate 20. The contacts C0 provided on the semiconductor substrate 20 are coupled to an impurity diffusion region (not illustrated) provided in the semiconductor substrate 20.

The conductive layer 21 is provided on the contact C0. The contact C1 is provided on the conductive layer 21. The conductive layer 22 is provided on the contact C1. The contact C2 is provided on the conductive layer 22. The conductive layer 23 is provided on the contact C2. Hereinafter, three interconnect layers in which the conductive layers 21 to 23 are respectively provided will be respectively referred to as interconnect layers D0 to D2.

The conductive layer 30 is provided above the conductive layer 23, with an insulating layer interposed therebetween. The conductive layer 30 is formed in, for example, a plate-like shape extending along the XY plane, and is used as a source line SL. The conductive layer 30 includes, for example, phosphorous-doped polysilicon.

The conductive layer 31 is provided above the conductive layer 30, with an insulating layer interposed therebetween. The conductive layer 31 is formed in, for example, a plate-like shape spreading along the XY plane, and is used as a select gate line SGS. The conductive layer 31 includes, for example, phosphorous-doped polysilicon.

The conductive layers 32 are provided above the conductive layer 31, with an insulating layer interposed therebetween. The conductive layers 32 are stacked along the Z direction, and an insulating layer is provided between adjacent two conductive layers 32. Each conductive layer 32 is formed in, for example, a plate-like shape spreading along the XY plane. The stacked conductive layers 32 are, in the order from the side of the semiconductor substrate 20, used as word lines WL0 to WL7. The conductive layers 32 include, for example, tungsten.

The conductive layer 33 is provided above the topmost conductive layer 32, with an insulating layer interposed therebetween. The conductive layer 33 is formed in, for example, a plate-like shape spreading along the XY plane, and is used as a select gate line SGD. The conductive layer 33 includes, for example, tungsten.

The conductive layers 34 are provided above the conductive layer 33, with an insulating layer interposed therebetween. Each conductive layer 34 is formed in, for example, a linear shape extending along the Y direction, and is used as a bit line BL. That is, a plurality of conductive layers 34 are aligned along the X direction in an unillustrated region. The conductive layers 34 include, for example, copper.

The conductive layer 35 is provided above the conductive layers 34, with an insulating layer interposed therebetween. The conductive layer 36 is provided above the conductive layer 35, with an insulating layer interposed therebetween. The conductive layers 35 and 36 are interconnects used to, for example, couple circuits in the semiconductor memory device 1 and supply power. Hereinafter, three interconnect layers in which the conductive layers 34 to 36 are respectively provided will be respectively referred to as interconnect layers M0 to M2.

Each of the memory pillars MP is provided in a columnar shape extending along the Z direction. Each memory pillar MP penetrates the conductive layers 31 to 33, and the bottom of the memory pillar MP is in contact with the conductive layer 30. Each memory pillar MP includes, for example, a semiconductor layer 40, a tunnel insulating film 41, an insulating film 42, and a block insulating film 43.

The semiconductor layer 40 is provided so as to extend along the Z direction. The semiconductor layer 40 has a columnar shape extending in the Z direction, with its width narrowed at the bottom. For example, an upper end of the semiconductor layer 40 is included in a layer above the conductive layer 33, and a lower end of the semiconductor layer 40 is in contact with the conductive layer 30. The tunnel insulating film 41 covers the side surface of the semiconductor layer 40. The insulating film 42 covers the side surface of the tunnel insulating film 41. The block insulating film 43 covers the side surface of the insulating film 42. In the memory pillar MP, each of the tunnel insulating film 41, the insulating film 42, and the block insulating film 43 may cover the side and bottom surfaces of its inner layer or film except a portion of the side surface thereof. Both of the tunnel insulating film 41 and the block insulating film 43 include, for example, silicon oxide ($SiO_2$). The insulating film 42 includes, for example, silicon nitride (SiN).

The portion where the memory pillar MP intersects the conductive layer 31 functions as a select transistor ST2. The portion where the memory pillar MP intersects each conductive layer 32 functions as a memory cell transistor MT. The portion where the memory pillar MP intersects the conductive layer 33 functions as a select transistor ST1. That is, the semiconductor layer 40 functions as a channel of each of the memory cell transistors MT0 to MT7 and the select transistors ST1 and ST2. The insulating film 42 functions as a charge storage layer of the memory cell transistor MT.

A contact CV is provided on the semiconductor layer 40 in the memory pillar MP. A top surface of the contact CV is in contact with one of the conductive layers 34, namely, one of the bit lines BL. In the illustrated region, a contact CV coupled to one of the two memory pillars MP is shown. A contact CV is coupled, in an unillustrated region, to the other memory pillar MP to which a contact CV is not coupled in the illustrated region.

The insulating member 53 is formed in, for example, a plate-like shape spreading along the XZ plane, so as to penetrate the conductive layers 31 to 33 provided above the conductive layer 30, and to divide the stacked structure provided above the conductive layer 30 into a plurality of structures in the Y direction. An upper end of the insulating member 53 is included in a layer between the conductive layers 33 and 34. A lower end of the insulating member 53 is in contact with the conductive layer 30. In other words, the insulating member 53 does not divide the conductive layer 30 in the Y direction, resulting in the conductive layer 30 having a greater length than the conductive layers 31 to 33 in the Y direction. The insulating member 53 corresponds to slits SLT1 to SLT3.

In the above-described configuration of the memory region MA of the semiconductor memory device 1, each of the structures between the slits SLT1 to SLT3 functions as a single string unit SU. As described above, a single contact CV is coupled to one of the conductive layers 34 (one of the bit lines BL) in each space separated by the slits SLT1 to SLT3. A linear contact may be formed in the slits SLT2 and SLT3. In this case, the linear contact is coupled to the source line SL, and insulation is provided between the contact and the conductive layers 31 to 33.

Figure 5:
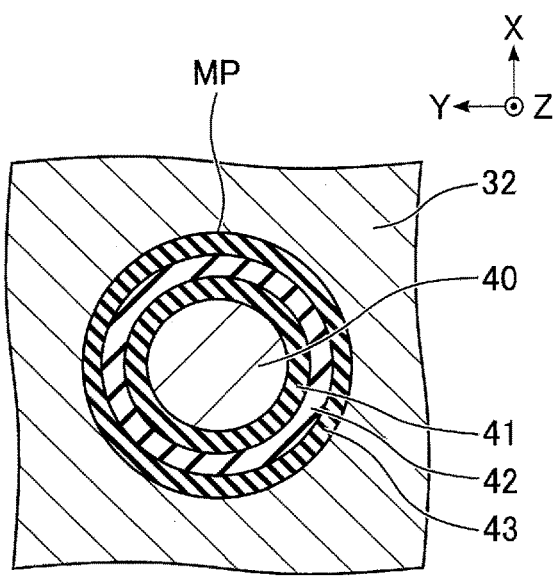
FIG. 5 is a cross-sectional diagram illustrating an example of a cross-sectional structure of a memory pillar in the semiconductor memory device according to the embodiment.

FIG. 5 illustrates an example of a cross-sectional structure of a memory pillar MP in the semiconductor memory device 1 according to the embodiment. More specifically, FIG. 5 shows a cross-sectional structure of a memory pillar MP in a layer parallel to the surface of the semiconductor substrate 20 and including the conductive layer 32.

As shown in FIG. 5, in the layer including the conductive layer 32, the semiconductor layer 40 is provided at, for example, the center of the memory pillar MP. The tunnel insulating film 41 surrounds the side surface of the semiconductor layer 40. The insulating film 42 surrounds the side surface of the tunnel insulating film 41. The block insulating film 43 surrounds the side surface of the insulating film 42. The conductive layer 32 surrounds the side surface of the block insulating film 43. The memory pillar MP may include a core member at the center of the inner portion of the semiconductor layer 40. The core member may include an insulator such as silicon oxide.

(Structure of Memory Cell Array 10 in Hookup Region HA)

Figure 6:
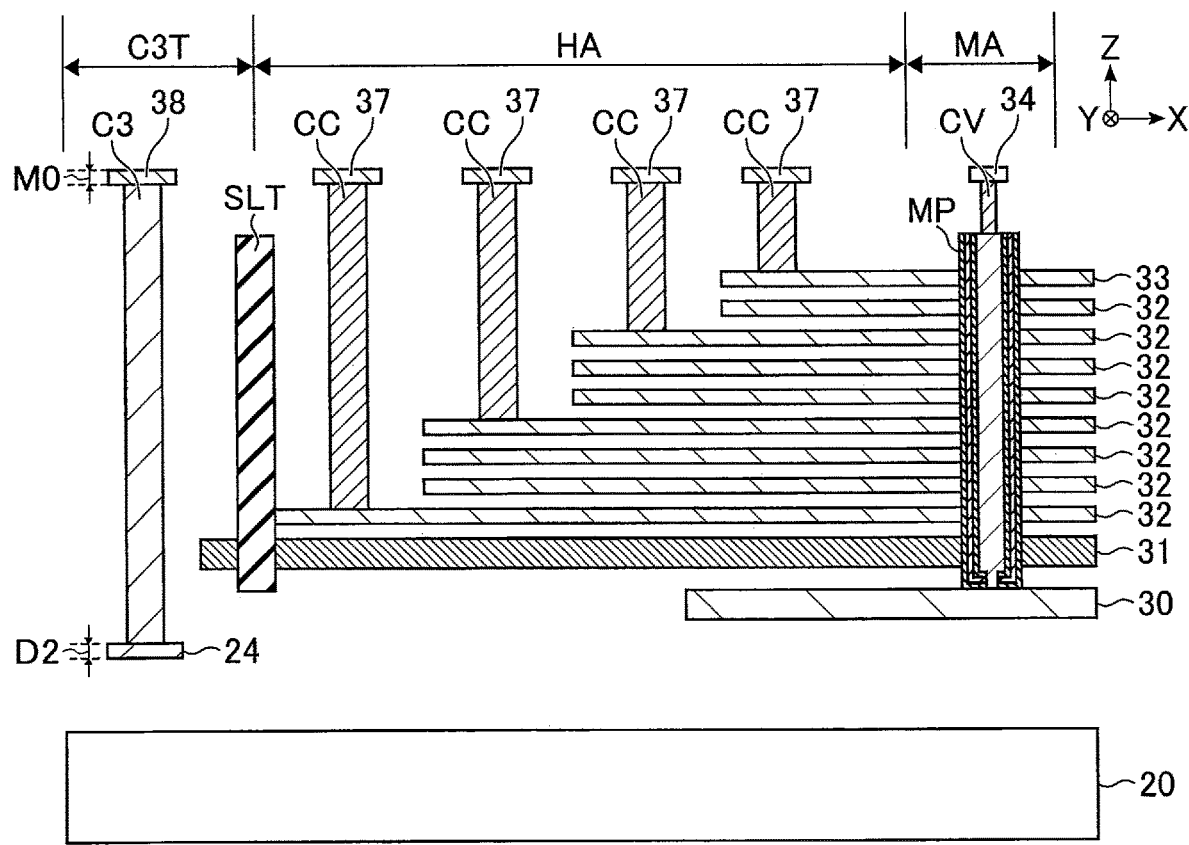
FIG. 6 is a cross-sectional diagram illustrating an example of a cross-sectional structure of a hookup region of a memory cell array included in the semiconductor memory device according to the embodiment.

FIG. 6 illustrates an example of a cross-sectional structure of the hookup region HA of the memory cell array 10 in the semiconductor memory device 1 according to the embodiment. In FIG. 6, parts of the memory region MA and the contact region C3T adjacent to the hookup region HA are also shown. As shown in FIG. 6, the semiconductor memory device 1 includes, in the hookup region HA, a plurality of contacts CC and a conductive layer 37, and includes, in the contact region C3T, a contact C3 and conductive layers 24 and 38.

End portions of the conductive layers 31 to 33, which respectively function as the select gate line SGS, the word lines WL, and the select gate line SGD in the memory region MA, are provided in, for example, a staircase shape in the hookup region HA. A single contact CC is provided on a terrace portion of each of the conductive layer 31, which functions as the select gate line SGS, the conductive layers 32, which respectively function as the word lines WL0 to WL7, and the conductive layer 33, which functions as the select gate line SGD. Of the plurality of contacts CC, four contacts CC, respectively coupled to the word lines WL0, WL3, and WL6 and the select gate line SGD, are illustrated in FIG. 6.

A single conductive layer 37 is provided on each of the contacts CC, in such a manner that the contact CC and the conductive layer 37 are electrically coupled. The conductive layer 37 is included in, for example, the same layer (wiring layer M0) as the conductive layer 34. In the present example, a case has been described, as an example, where the stacked interconnects such as the word lines WL have a staircase structure with three-layer steps; however, the stacked interconnects in the hookup region HA may be formed in a staircase shape with steps of any number of layers. The staircase structure to be formed may vary among the select gate line SGS, the word lines WL, and the select gate lines SGD. The conductive layer 37 may be provided in a layer different from the conductive layer 34.

In the contact region C3T, the conductive layer 24 is provided in the wiring layer D2. The contact C3 is provided on the conductive layer 24. The contact C3 is provided in a columnar shape extending along the Z direction. A conductive layer 38 is provided on the contact C3. Thereby, the conductive layer 24 provided below the stacked interconnects such as the word lines WL and the conductive layer 38 provided above the stacked interconnects are electrically coupled via the contact C3. The conductive layer 38 is included in, for example, the same layer (wiring layer M0) as the conductive layer 34. The conductive layer 38 may be provided in a layer different from the conductive layer 34.

(Configuration of Memory Cell Array 10 in Contact Region C4T)

FIG. 7 illustrates an example of a plane layout of the contact region C4T of the memory cell array 10 in the semiconductor memory device 1 according to the embodiment. As shown in FIG. 7, a region in the contact region C4T between two slits SLT (hereinafter referred to as "adjacent slits SLT") extending in the X direction and adjacent to each other in the Y direction is divided into a middle region MR and bypass regions BR. The middle region MR is a region located at an intermediate portion between the adjacent slits SLT, and includes a penetration region PA. The bypass region BR is a region between the middle region MR and the slit SLT.

The middle region MR includes support pillars HRd and a contact C4. For example, the support pillars HRd, each having a circular planar shape, are provided in a staggered arrangement in the middle region MR, excluding the penetration region PA. The contact C4 is arranged at, for example, the central portion of the penetration region PA. The support pillars HRd may be arranged in the penetration region PA, and preferably be separate from the contact C4.

The bypass regions BR include support pillars HRo and HRe. Each of the support pillars HRo and HRe has an oblong shape, such as an oval or a rectangle, in a planar view. In other words, each of the pillars HRo and HRe includes a portion that extends along the slit SLT extending in the X direction. The support pillars HRo and HRe respectively correspond to the support pillars arranged in the odd-numbered rows and the even-numbered rows, from the side of the middle region MR, between the middle region MR and the slit SLT. In the description that follows, the support pillars HRo arranged in the odd-numbered rows will be referred to as "odd-numbered support pillars HRo", and the support pillars HRe arranged in the even-numbered rows will be referred to as "even-numbered support pillars HRe".

In the bypass regions BR, the odd-numbered support pillars HRo and the even-numbered support pillars HRe are arranged in an alternating manner. In other words, the odd-numbered support pillars HRo and the even-numbered support pillars HRe are arranged in a zigzag pattern in the Y direction. In addition, the support pillars HRo and HRe in each row include a plurality of support pillars HRo and HRe adjacent to each other in the X direction in each row, and the support pillars HRo and HRe are in a staggered arrangement in the bypass regions BR in a planar view. Specifically, the odd-numbered support pillars HRo are aligned along the X direction, with a gap portion GPo interposed therebetween. The even-numbered support pillars HRe are aligned along the X direction, with a gap portion GPe interposed therebetween. The gap portion GPo and the gap portion GPe are arranged in an alternating manner. For example, the gap portion GPe is arranged at a position between two adjacent gap portions GPo in the X direction. The gap portion GPo may be arranged at a position between two adjacent gap portions GPe in the X direction, depending on the arrangement of the support pillars HRo and HRe.

Through the arrangement of the oblong support pillars HRo and HRe in a zigzag pattern in the vertical direction, a facing portion FP is provided between adjacent support pillars HRo and HRe in the Y direction. In the case of, for example, the support pillar HRo adjacent to the contact C4, a facing portion FP is provided between the gap portion GPe and the gap portion GPo on the left side of the drawing of that support pillar HRo, and between the gap portion GPe and the gap portion GPo on the right side of the drawing of that support pillar HRo. The adjacent facing portions FP are designed, for example, to have a substantially same length in the X direction. The number of sets of support pillars HRo and HRe aligned in the Y direction in the bypass region BR is at least one.

Figure 8:
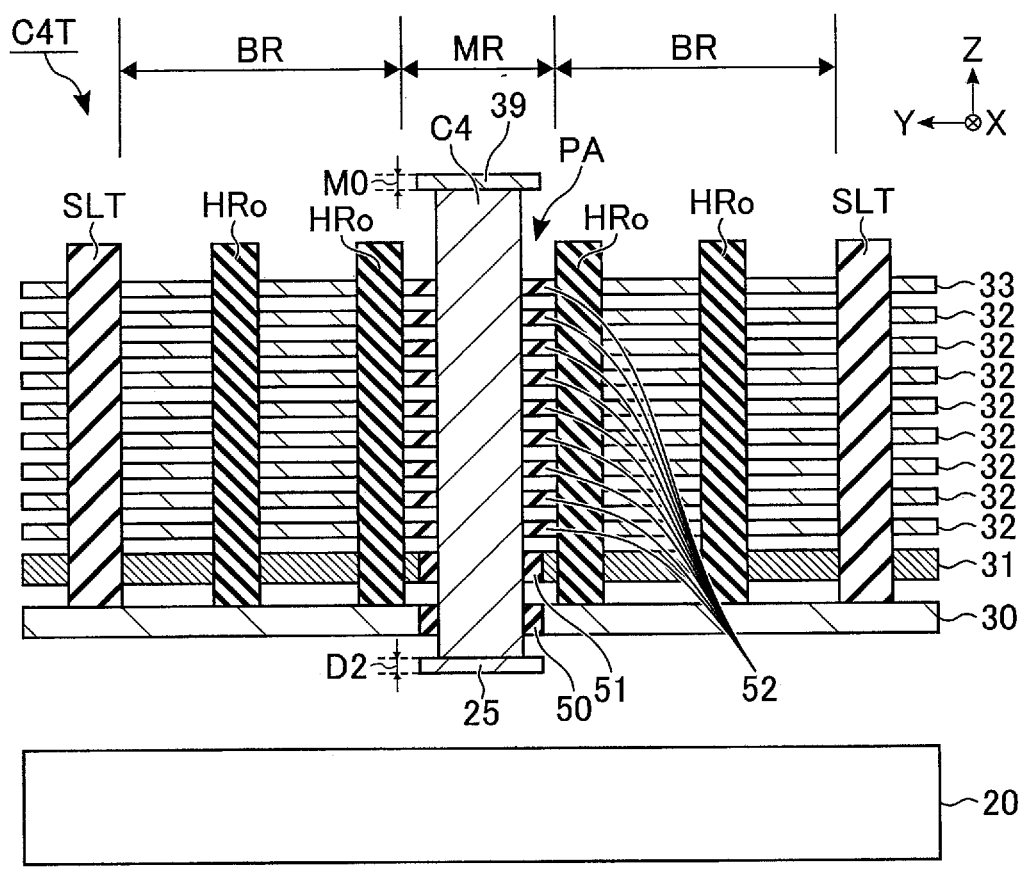
FIG. 8 is a cross-sectional view illustrating an example of a cross-sectional structure of the memory cell array included in the semiconductor memory device according to the embodiment.

FIG. 8 illustrates an example of a cross-sectional structure of the contact region C4T of the memory cell array 10 in the semiconductor memory device 1 according to the embodiment, showing a cross section cut along the Y direction and including the contact C4 shown in FIG. 7. As shown in FIG. 8, the semiconductor memory device 1 further includes, in the penetration region PA in the middle region MR, insulating layers 50 and 51, a plurality of sacrificial members 52, and conductive layers 25 and 39.

The insulating layer 50 is provided in the penetration region PA in the same layer as the conductive layer 30. The insulating layer 51 is provided in the penetration region PA in the same layer as the conductive layer 31. The sacrificial members 52 are provided in the penetration region PA in the same layers as the conductive layers 32 and 33. In this manner, the stacked structure in the penetration region PA is different from the stacked structure in the memory region MA or the other regions in the contact region C4T. The sacrificial members 52 are members used for a replacement process of the stacked interconnects, to be described later, and include, for example, silicon nitride.

The conductive layer 25 is coupled to a circuit provided below the memory cell array 10, and is included in a region at which the interconnect layer D2 and the penetration region PA intersect. The contact C4 is provided on the conductive layer 25. A conductive layer 39 is provided on the contact C4. The conductive layer 39 is coupled to a circuit provided above the memory cell array 10, and is included in a region at which the interconnect layer M0 and the penetration region PA intersect.

The contact C4 is provided in a columnar shape extending in the Z direction, and penetrates the sacrificial members 52 and the insulating layers 50 and 51. Insulation is provided between the contact C4 and the conductive layer 30 by the insulating layer 50. Insulation is provided between the contact C4 and the conductive layer 31 by the insulating layer 51. Insulation is provided between the contact C4 and the conductive layers 32 and 33 by the sacrificial members 52. The insulating layers 50 and 51 include, for example, silicon oxide.

In the contact region C4T, the support pillars HRo, HRe, and HRd are provided in a columnar shape extending in the Z direction, and penetrate the conductive layers 31 to 33. Upper ends of the support pillars HRo, HRe, and HRd are included in a layer between the interconnect layer M0 and the conductive layer 33. Lower ends of the support pillars HRo, HRe, and HRd are in contact with, for example, the conductive layer 30. In the support pillars HRo, HRe, and HRd, an insulating member, for example, is embedded. The lower ends of the support pillars HRo, HRe, and HRd reach at least the conductive layer 31. The support pillars HRo, HRe, and HRd may have a structure similar to that of the memory pillar MP.

The above-described conductive layers 32 and 33 between the slits SLT are provided by a replacement process in which the sacrificial members 52 are replaced with a conductor. Briefly speaking, in the replacement process, the sacrificial members 52 are preliminarily formed in a region in which the word lines WL, for example, are to be formed, the sacrificial members 52 are selectively etched via the slit SLT, and a conductor is formed in the space from which the sacrificial members 52 have been removed.

Figure 9:
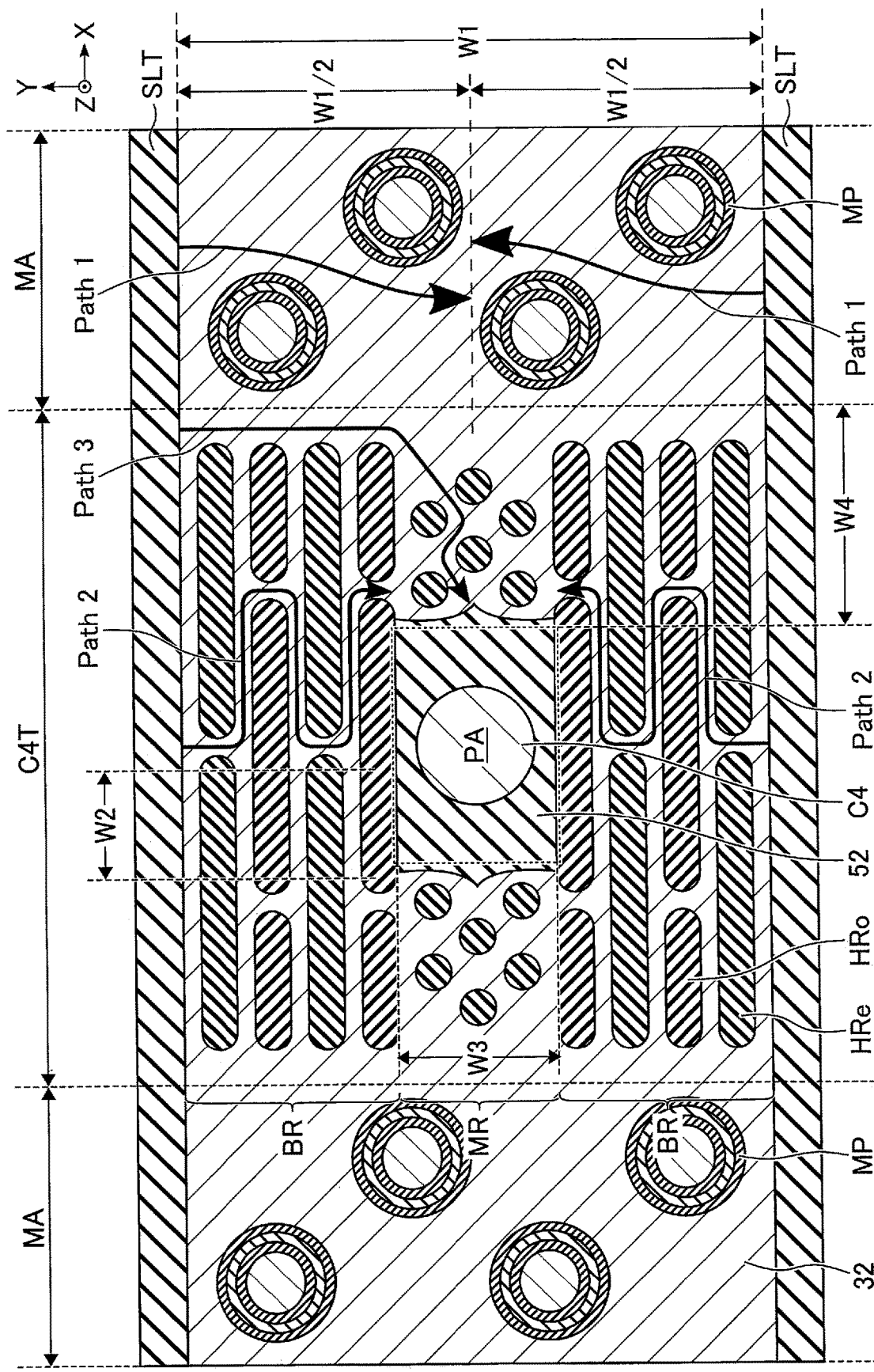
FIG. 9 is a cross-sectional view illustrating an example of a cross-sectional structure of the memory cell array included in the semiconductor memory device according to the embodiment.

FIG. 9 shows an example of a cross-sectional structure of the memory cell array 10 in the semiconductor memory device 1 according to the embodiment, in which a region including the contact region C4T and the memory region MA is shown. In the description that follows, "W1" to "W4" are defined as follows. "W1" represents the length between adjacent slits SLT. "W2" represents the width of the facing portion FP in the X direction. "W3" represents the width of the penetration region PA in the Y direction. "W4" represents the length from an end portion of the contact region C4T to the penetration region PA in the X direction. "W1/2" represents half the distance from the slit SLT to a slit SLT adjacent thereto, and corresponds to half of W1.

FIG. 9 shows a cross-section parallel to the surface of the semiconductor substrate 20 and including the conductive layer 32, and the region in which the conductive layer 32 is provided corresponds to the region from which the sacrificial members 52 have been selectively removed by etching via the slit SLT. As shown in FIG. 9, the replacement process in the present embodiment is performed in such a manner that the sacrificial members 52 in the penetration region PA remain, and the selective etching of the sacrificial members 52 is advanced along a path that circumvents the memory pillar MP and the support pillars HRo, HRe, and HRd. Typical etching paths of the sacrificial members 52 include, for example, Paths 1 to 3.

Path 1 is an example of a path in the memory region MA along which the sacrificial members 52 provided on side portions of the memory pillars MP are etched, leading from the slit SLT to an intermediate position between the slit SLT and a slit SLT adjacent thereto. In other words, Path 1 shows the shortest path that leads from the slit SLT, bypasses the memory pillars MP, and arrives at the intermediate position between the adjacent slits SLT in the memory region MA.

The sacrificial members 52 provided in the periphery of the memory pillar MP correspond to the positions at which interconnects for controlling the transistors in the memory pillar MP are formed. Accordingly, all the sacrificial members 52 in the memory region MA are replaced with a conductor. Thus, in the etching of the sacrificial members 52 in the replacement process, the sacrificial members 52 are removed from the region at which the distance from the slit SLT is at least w1/2 in the memory region MA.

Path 2 is an example of a path in the contact region C4T along which the sacrificial members 52 provided on side portions of the support pillars HRe and HRo are etched, leading from the slit SLT to the middle region MR. In other words, Path 2 shows the shortest path in the contact region C4T that leads from the slit SLT, bypasses the support pillars HRe and HRo, namely, passes through the facing portions FP, and arrives at the vicinity of the penetration region PA. The length of Path 2 is set to be greater than at least the length of Path 1.

In the semiconductor memory device 1 according to the present embodiment, the sacrificial members 52 in the contact region. C4T remain in the region (penetration region PA) which the contact C4 penetrates. The sacrificial members 52 provided between the support pillars HRe and HRo in the contact region C4T are replaced with a conductor in such a manner that at least between adjacent memory regions MA are connected, with a contact region C4T interposed therebetween.

The bypass path of the etching solution in the contact region C4T increases as the width W2 of the facing portion FP of the support pillars HRo and HRe increases. In the present embodiment, the sum of the lengths of the facing portions FP included in Path 2 is designed to be, for example, equal to or greater than half the length of W3. The etching time of the sacrificial members 52 in the replacement process is adjusted in such a manner that the sacrificial members 52 in the memory region MA are removed and the sacrificial members 52 in the penetration region PA are not removed.

Path 2 passing through a bypass region BR provided on one side of the middle region MR and Path 2 passing through a bypass region BR provided on the other side of the middle region MR have substantially equal lengths. The support pillars HRe and HRo in the bypass region BR provided on one side of the middle region MR and the support pillars HRe and HRo in the bypass region BR provided on the other side of the middle region MR are arranged so as to be substantially line-symmetric with respect to the middle region MR.

Path 3 is an example of a path which leads from the slit SLT to the penetration region PA in the vicinity of the boundary between the contact region C4T and the memory region MA, and along which the sacrificial members 52 provided on side portions of the support pillars HRe, HRo, and HRd and side portions of the memory pillars MP are etched. In other words, Path 3 shows the shortest path that leads from the slit SLT, passes through the vicinity of the boundary between the contact region C4T and the memory region MA, bypasses the support pillars HRe, HRo, and HRd and the memory pillars MP, and arrives at the vicinity of the penetration region PA.

In the vicinity of the boundary between the contact region C4T and the memory region MA, the etching solution bypasses the region in which the support pillars HRo and HRe are gathered, and enters the middle region MR. The width of Path 3 entering the middle region MR in the X direction is W4, and is designed in such a manner that the sacrificial members 52 in the penetration region PA remain. In the present embodiment, the length of Path 3 is substantially equal to that of Path 2, and is longer than that of Path 1. The size of the penetration region PA may be adjusted according to the arrangement, shape, etc. of the support pillars HRo and HRe.

[1-2] Method of Manufacturing Semiconductor Memory Device 1

Figure 10:
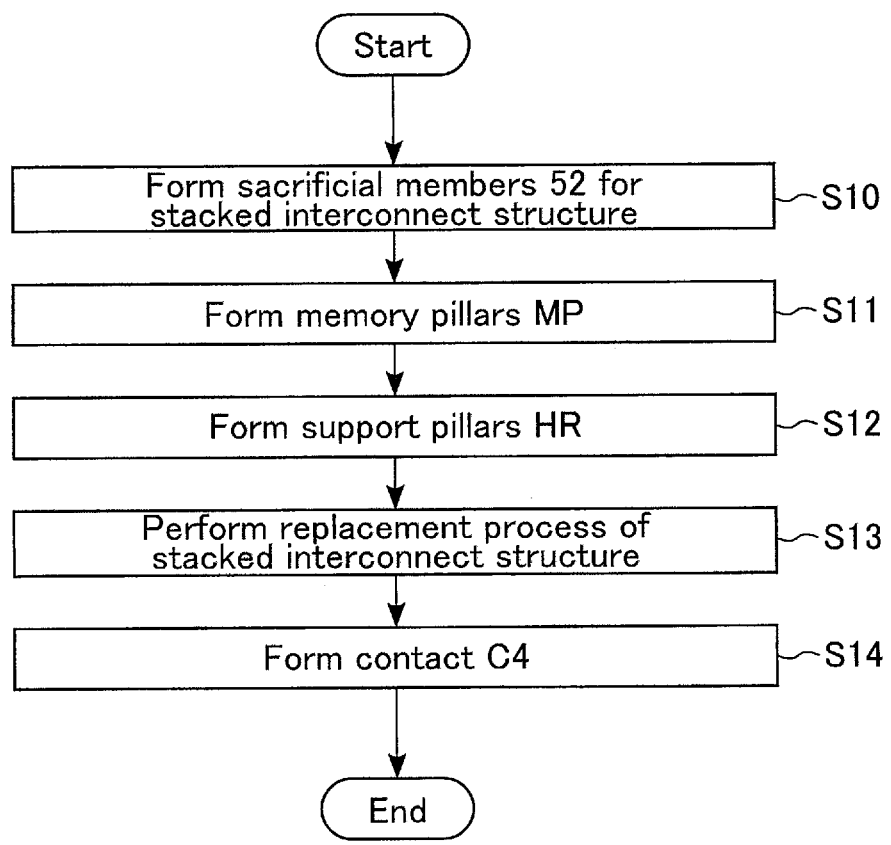
FIG. 10 is a flowchart showing an example of a method of manufacturing a semiconductor memory device according to the embodiment.

Hereinafter, an example of a series of manufacturing steps for formation of a stacked interconnect structure in the memory cell array 10 in the semiconductor memory device 1 according to the embodiment will be described, with reference to FIG. 10. FIG. 10 is a flowchart showing an example of a method of manufacturing a semiconductor memory device according to the embodiment. Each of FIGS. 11 to 19 shows an example of a cross-sectional structure of the semiconductor memory device 1 in the course of manufacturing according to the embodiment, in which a region in the memory region MA in which a memory pillar MP is to be formed and a region in the contact region C4T in which a contact C4 is to be formed are shown.

Figure 11:
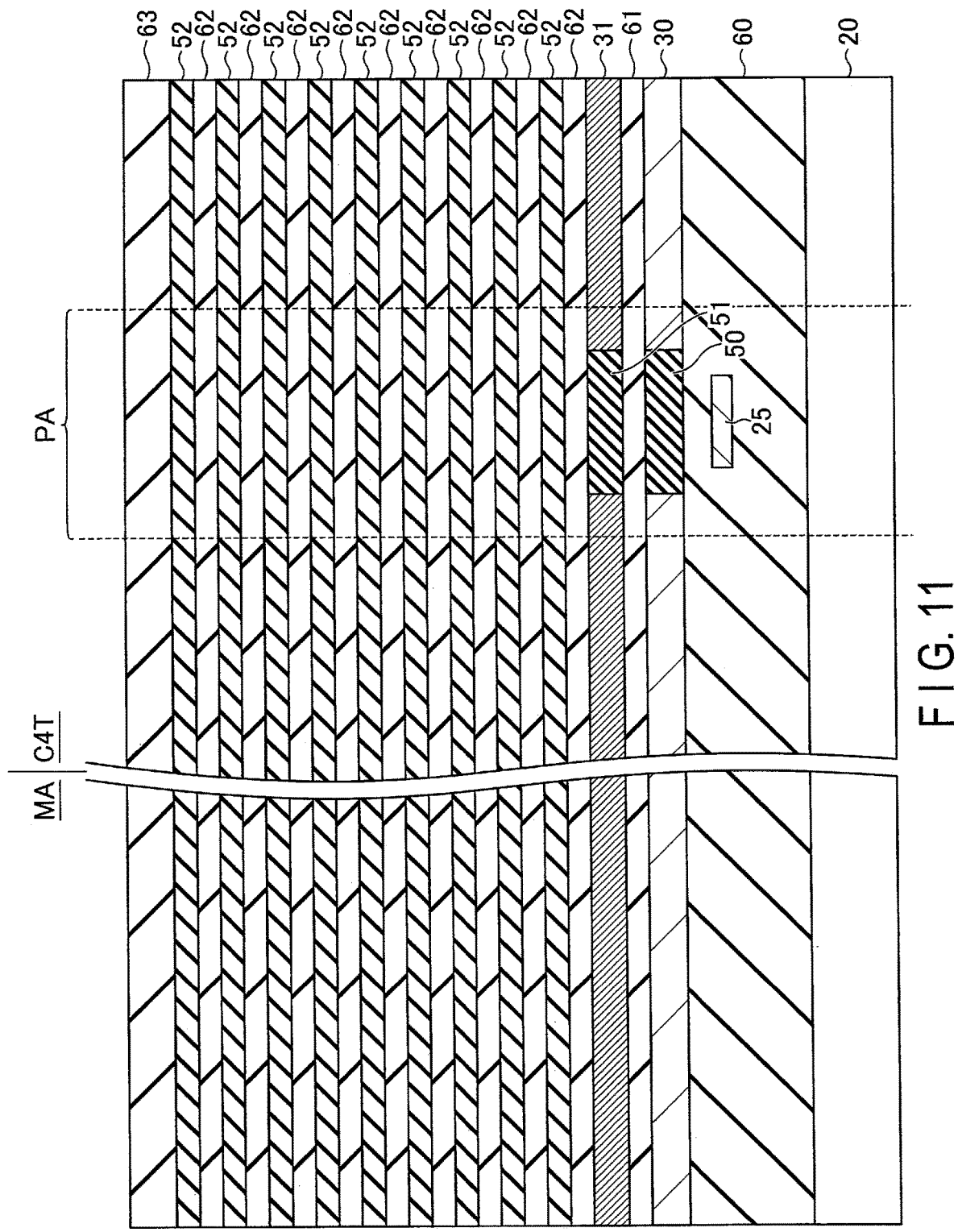
FIG. 11 is a cross-sectional diagram illustrating an example of a cross-sectional structure of the semiconductor memory device in the course of manufacturing according to the embodiment.

As shown in FIG. 11, a plurality of sacrificial members 52 corresponding to stacked interconnects are stacked (step S10). Specifically, an insulating layer 60 including a conductive layer 25 is formed on a semiconductor substrate 20. Although illustration is omitted, a circuit corresponding to, for example, a sense amplifier module is formed in the insulating layer 60. A conductive layer 30 is formed on the insulating layer 60. In the penetration region PA, part of the conductive layer 30 is removed, and an insulating layer 50 is formed. A conductive layer 31 is provided above the conductive layer 30 and the insulating layer 50, with an insulating layer 61 interposed therebetween. In the penetration region PA, part of the conductive layer 31 is removed, and an insulating layer 51 is formed.

After that, insulating layers 62 and sacrificial members 52 are alternately stacked on the conductive layer 31. An insulating layer 63 is formed on the topmost sacrificial member 52. The insulating layers 50 and 51 may be formed together by removing part of the conductive layers 30 and 31 after formation of the conductive layers 30 and 31. The insulating layers 60 to 63 may be formed of, for example, silicon oxide.

Figure 12:
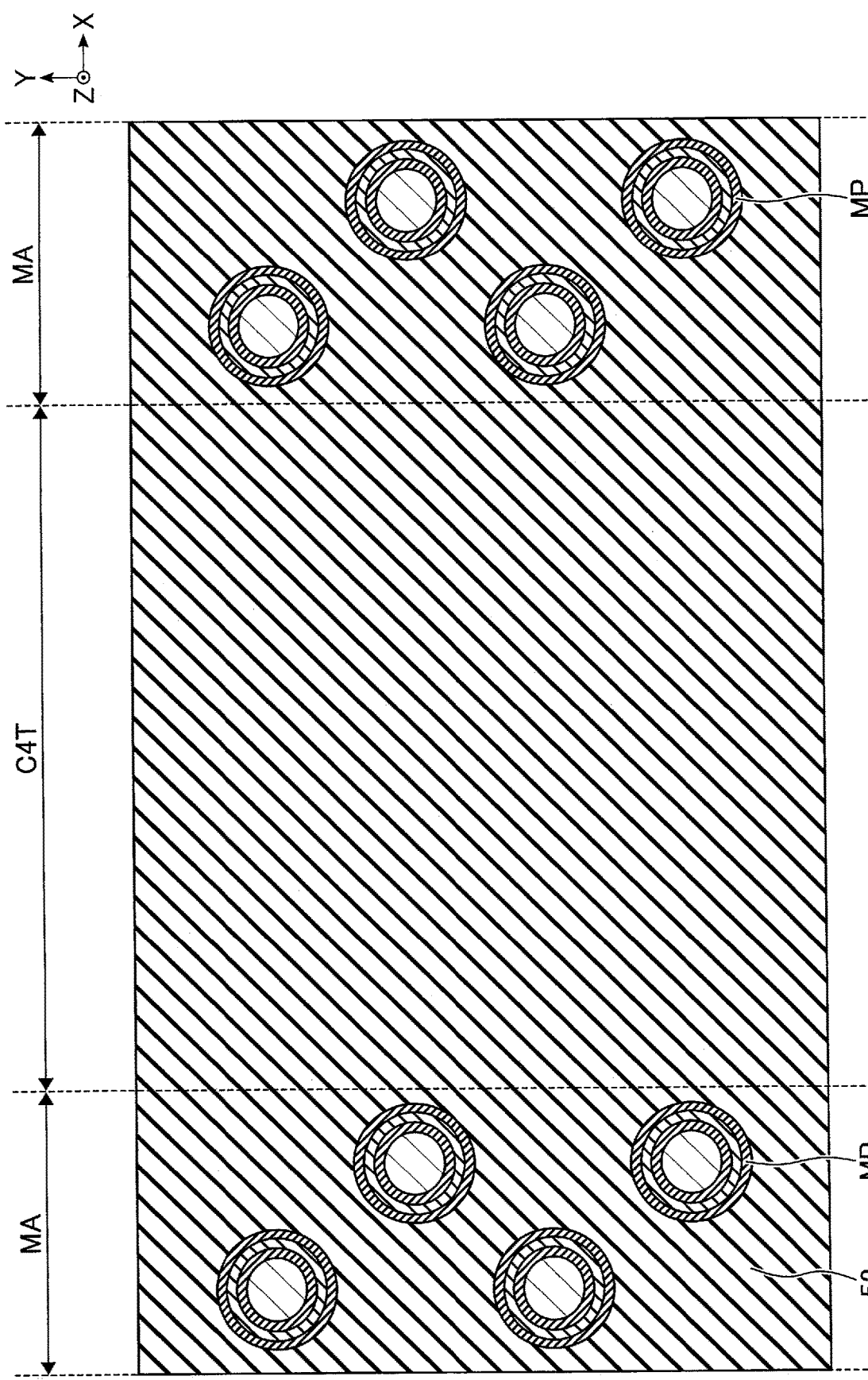
FIG. 12 is a cross-sectional diagram illustrating an example of a cross-sectional structure of the semiconductor memory device in the course of manufacturing according to the embodiment.
Figure 13:
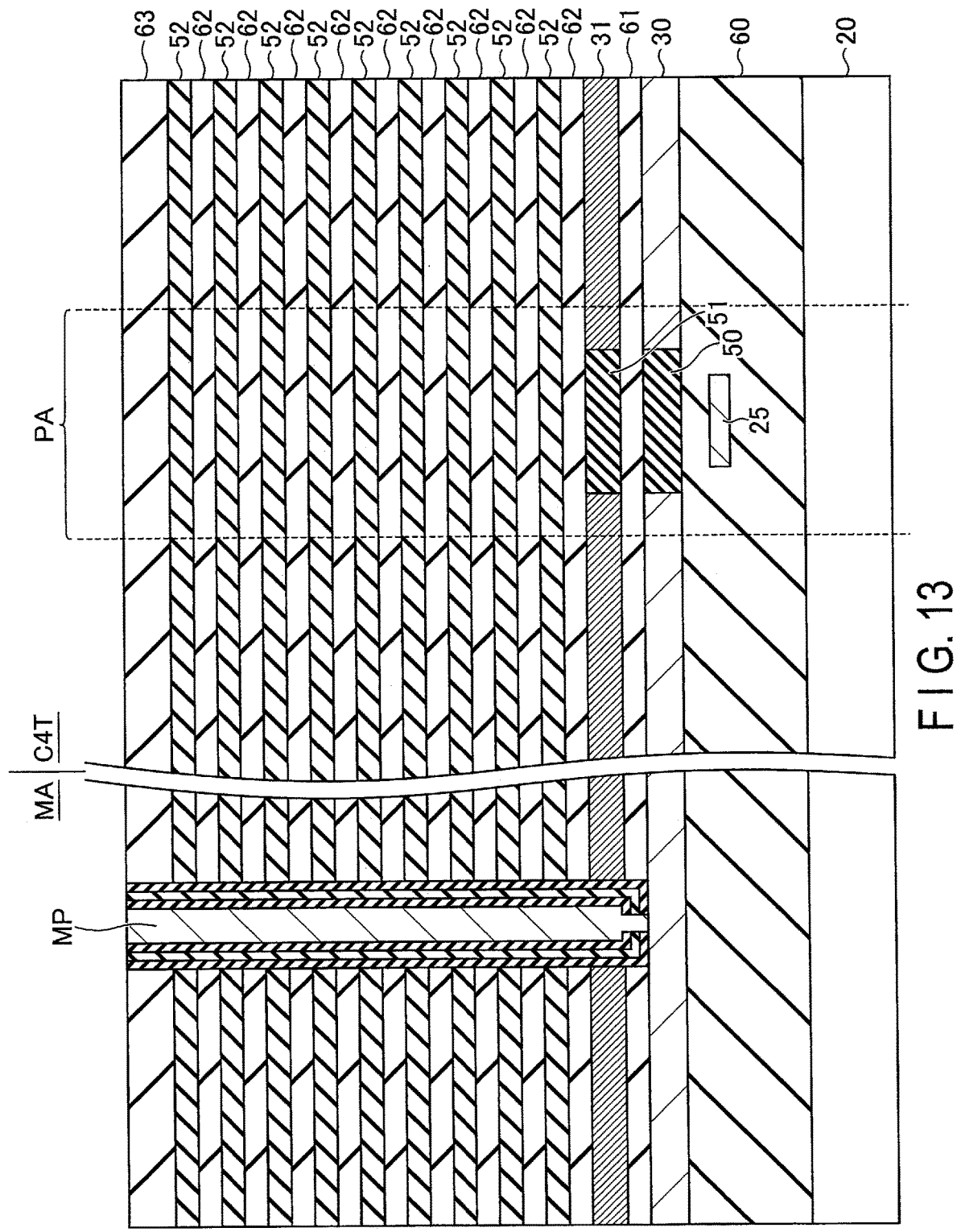
FIG. 13 is a cross-sectional diagram illustrating an example of a cross-sectional structure of the semiconductor memory device in the course of manufacturing according to the embodiment.

Subsequently, as shown in FIGS. 12 and 13, memory pillars MP are formed (step S11). Specifically, a mask including openings at positions corresponding to memory pillars MP is formed by, for example, photolithography. Memory holes are formed by anisotropic etching using the formed mask. Each memory hole penetrates the insulating layers 61 to 63, the conductive layer 31, and the sacrificial members 52, and the conductive layer 30 is exposed to the bottom of the memory hole. After that, a block insulating film 43, an insulating film 42, and a tunnel insulating film 41 are sequentially formed on the side surface and the bottom surface of the memory hole. Thereafter, the block insulating film 43, the insulating film 42, and the tunnel insulating film 41 are partly removed at the bottom of the memory hole, and the semiconductor layer 40 is embedded in the memory hole MH.

Figure 14:
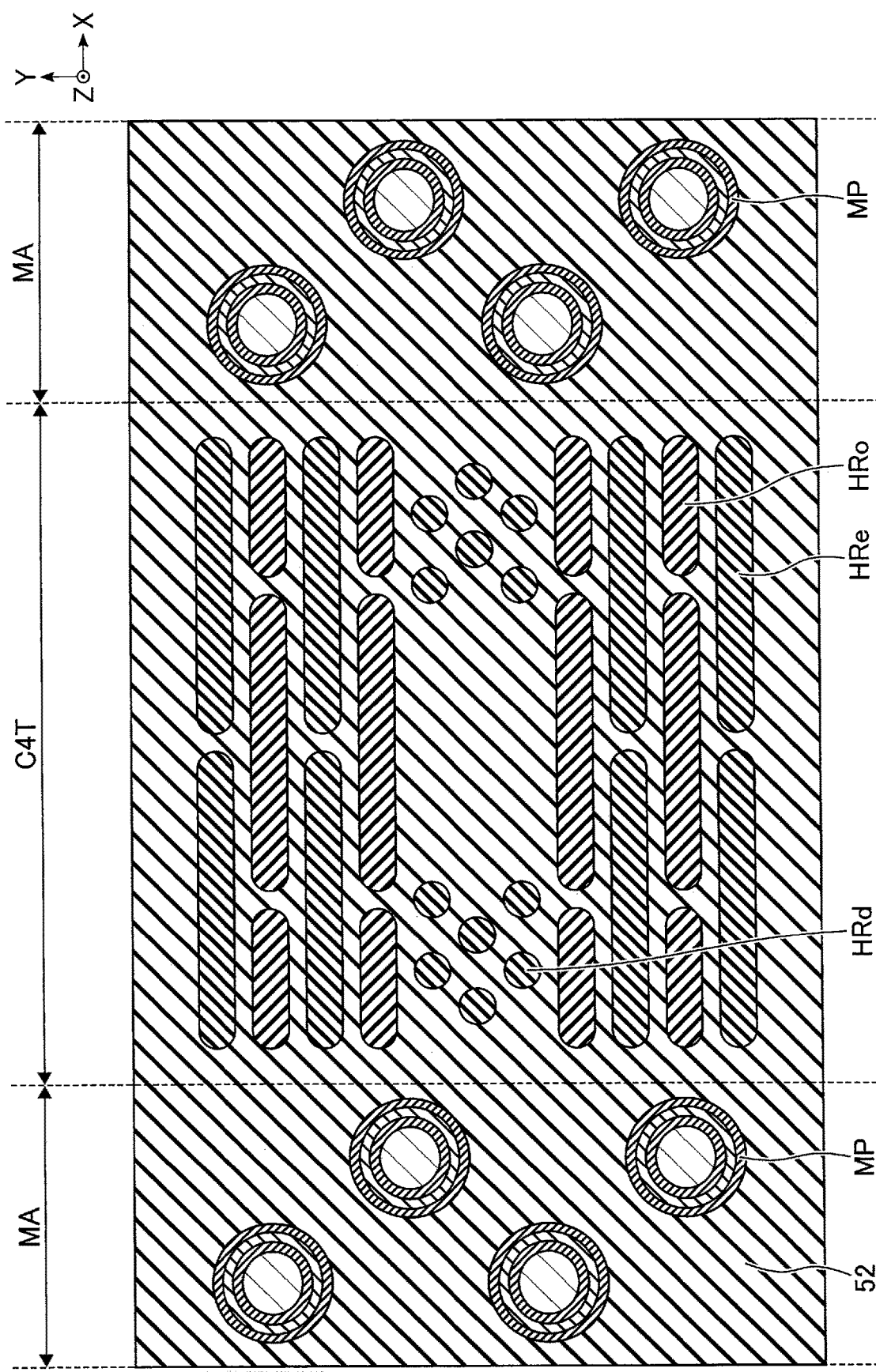
FIG. 14 is a cross-sectional diagram illustrating an example of a cross-sectional structure of the semiconductor memory device in the course of manufacturing according to the embodiment.
Figure 15:
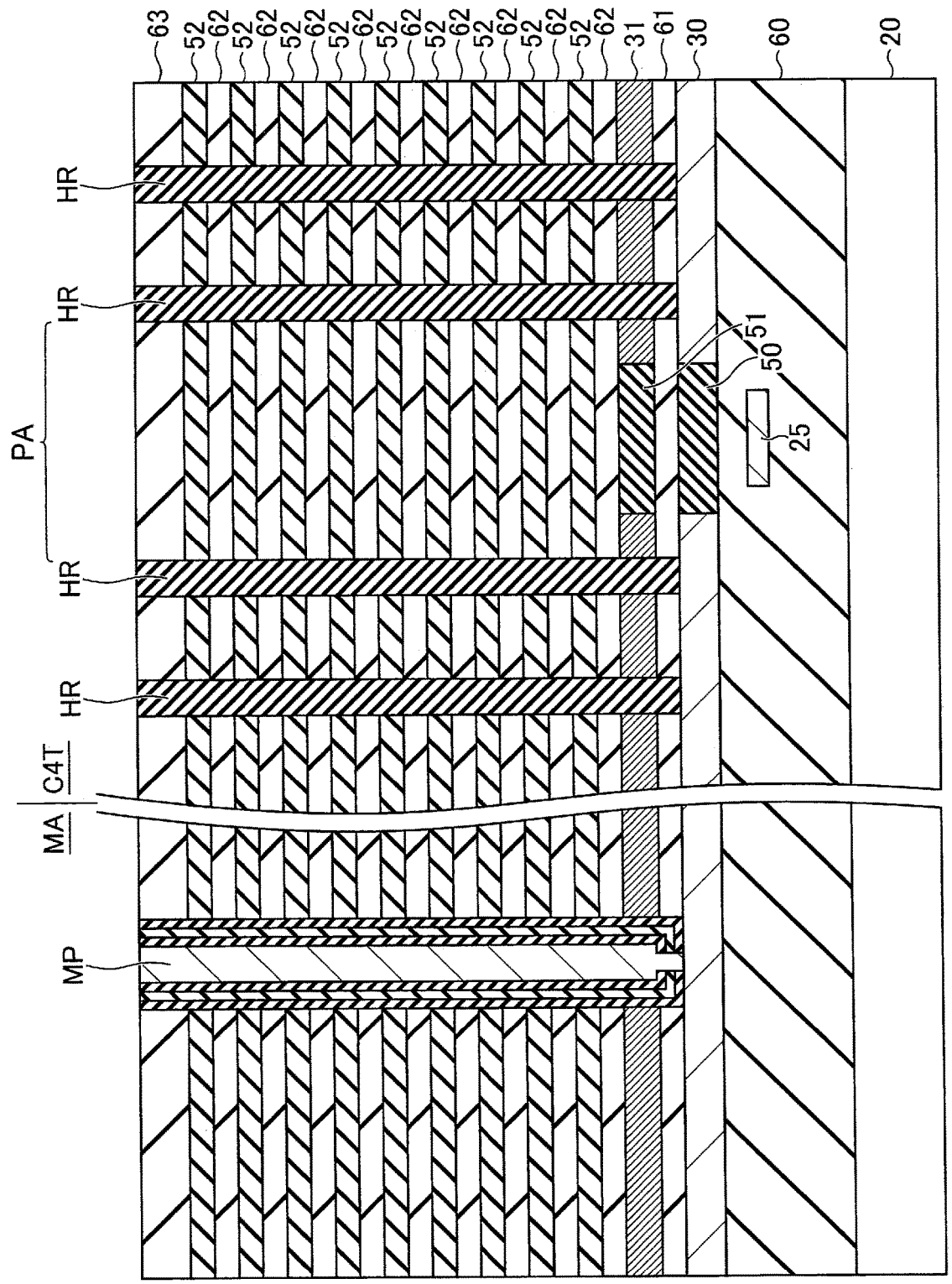
FIG. 15 is a cross-sectional diagram illustrating an example of a cross-sectional structure of the semiconductor memory device in the course of manufacturing according to the embodiment.

Subsequently, support pillars HRo, HRe, and HRd are formed, as shown in FIGS. 14 and 15 (step S12). Specifically, a mask including openings at positions corresponding to support pillars HRo, HRe, and HRd is formed by, for example, photolithography. After that, a plurality of holes respectively corresponding to the support pillars HRo, HRe, and HRd are formed by anisotropic etching using the formed mask. These holes penetrate the insulating layers 61 to 63, the conductive layer 31, and the sacrificial members 52, and the conductive layer 30 is exposed to the lower ends thereof. Thereafter, an insulator, for example, is embedded in these holes, and thereby support pillars HRo, HRe, and HRd are formed.

Figure 16:
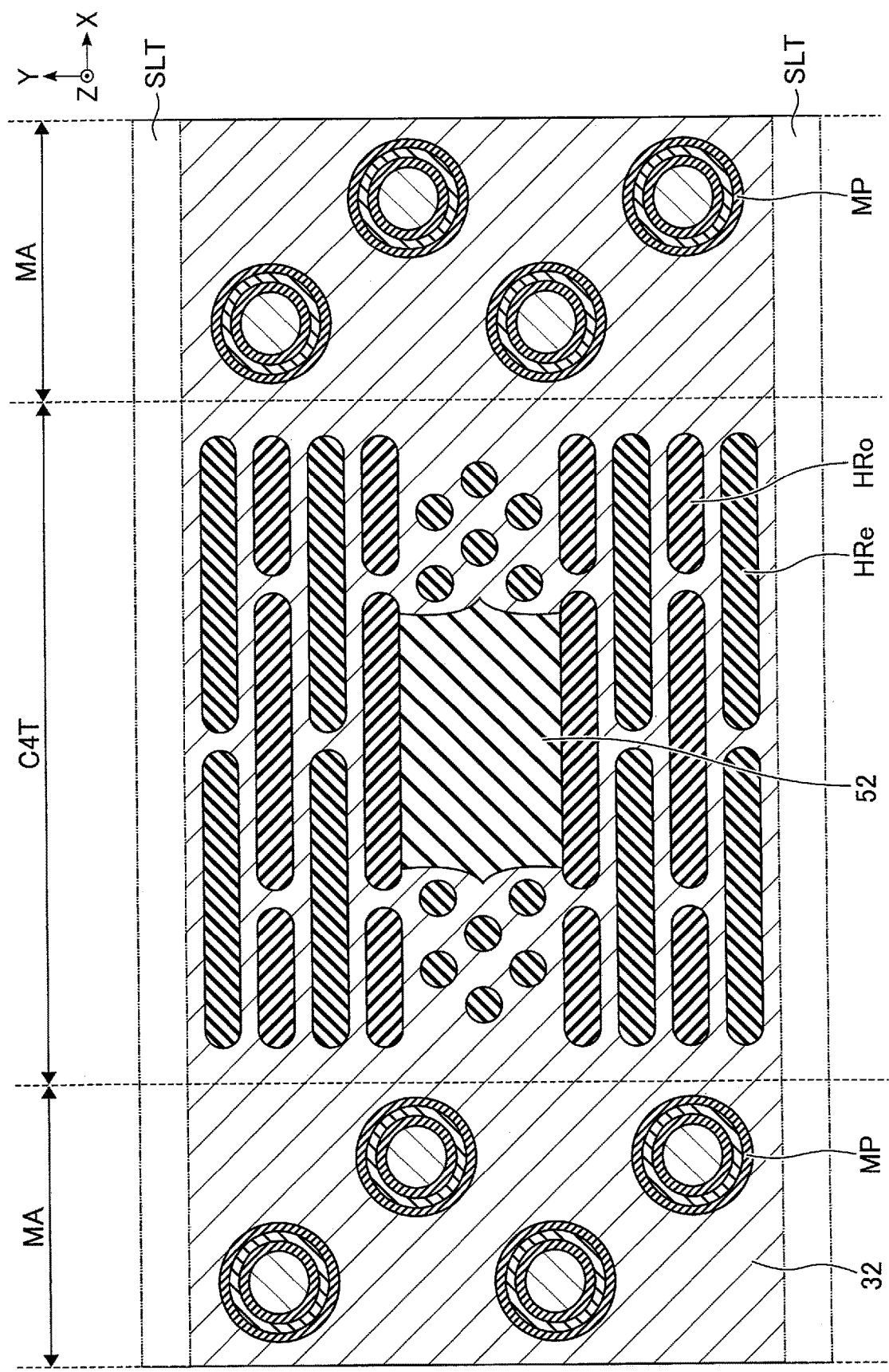
FIG. 16 is a cross-sectional diagram illustrating an example of a cross-sectional structure of the semiconductor memory device in the course of manufacturing according to the embodiment.
Figure 17:
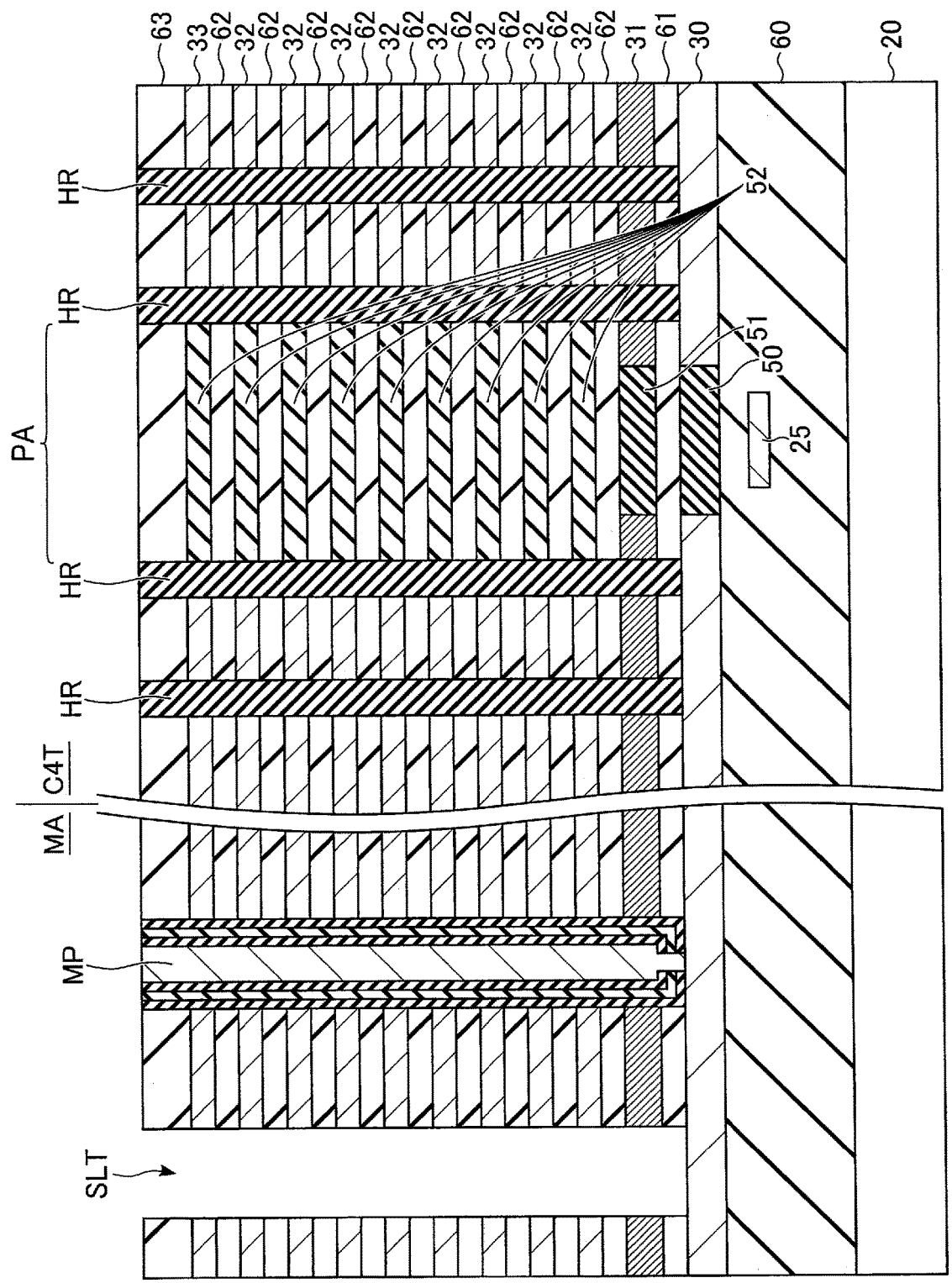
FIG. 17 is a cross-sectional diagram illustrating an example of a cross-sectional structure of the semiconductor memory device in the course of manufacturing according to the embodiment.

Subsequently, a replacement process of the stacked interconnect structure is performed, as shown in FIGS. 16 and 17 (step S13). Specifically, a mask including openings at positions corresponding to slits SLT is formed by, for example, photolithography, and the slits SLT are formed by anisotropic etching using the mask. Each slit SLT divides, for example, the insulating layers 61 to 63, the conductive layer 31, and the sacrificial members 52. After that, the sacrificial members 52 are selectively removed via the slit SLT by, for example, wet etching using thermal phosphoric acid. The three-dimensional architecture of the structure from which sacrificial members 52 have been removed is maintained by, for example, the memory pillars MP and the support pillars HRo, HRe, and HRd.

In the step of removing the sacrificial members 52, etching advances along Paths 1 to 3, described with reference to FIG. 9. The conditions under which etching in this step is performed are set in such a manner that, ideally, all the sacrificial members 52 in the memory region MA are etched, and the sacrificial members 52 remain in the penetration region PA. In the present embodiment, etching in the contact region C4T is advanced through a plurality of facing portions FP formed by the support pillars HRo and HRe arranged in an alternating manner. Thus, the etching in the contact region C4T allows the advancement of etching in a direction away from the slit SLT along the Y direction to be retarded, enabling the sacrificial members 52 in the penetration region PA to remain.

After that, a conductor is embedded, via the slit SLT, in the space from which the sacrificial members 52 are removed. In the formation of the conductor in this step, chemical vapor deposition (CVD), for example, is used. Thereafter, the conductor formed in the slit SLT is removed by an etch-back process. In this step, the conductor formed in adjacent interconnect layers is separated at least in the slit SLT.

Thereby, conductive layers 32, which respectively function as word lines WL0 to WL7, and a conductive layer 33, which functions as a select gate line SGD, are formed. The conductive layers 32 and 33 formed in this step may include a barrier metal. In the formation of the conductor after the removal of the sacrificial members 52, tungsten is formed after, for example, a titanium nitride film is formed as a barrier metal.

Figure 18:
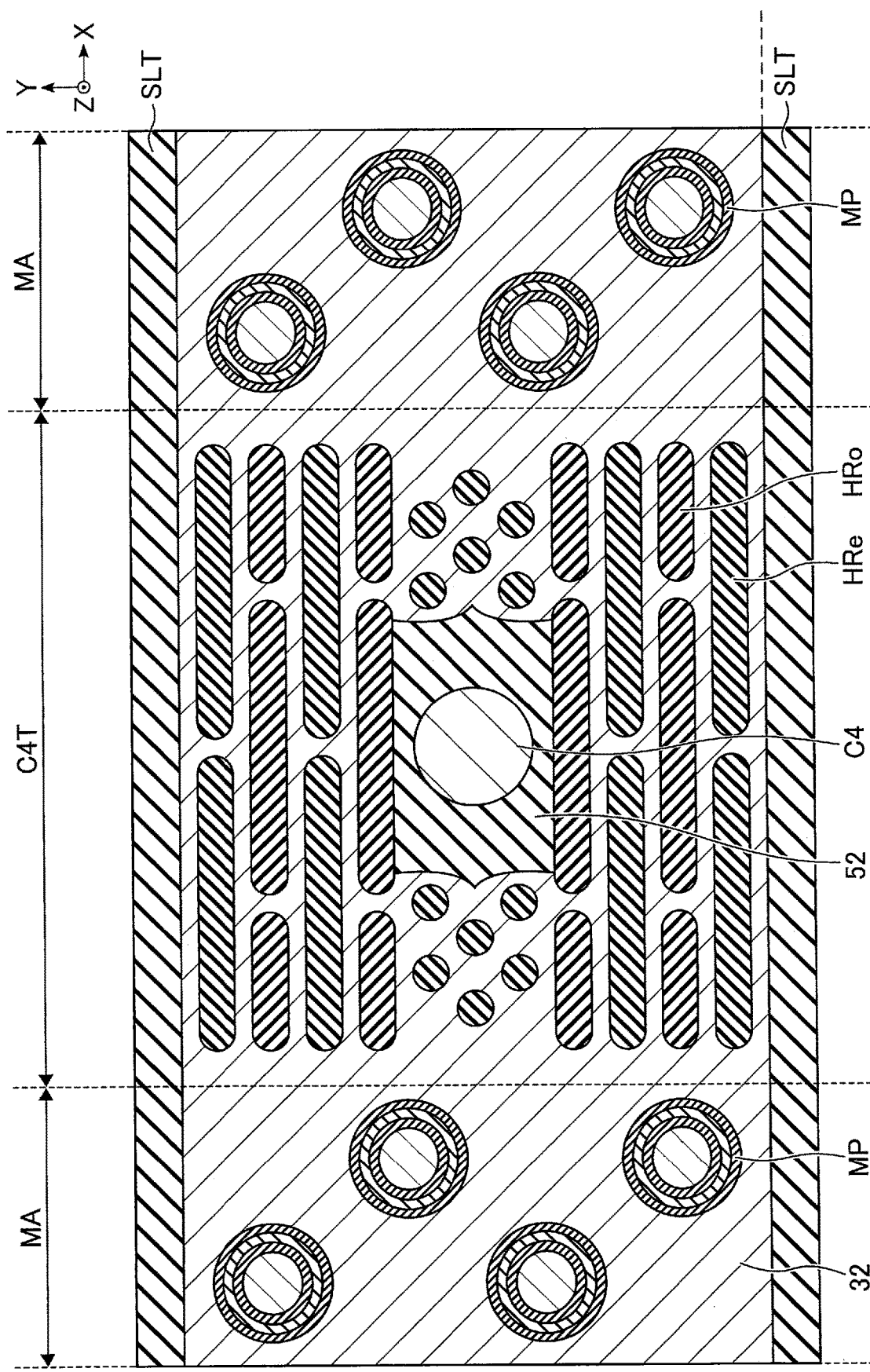
FIG. 18 is a cross-sectional diagram illustrating an example of a cross-sectional structure of the semiconductor memory device in the course of manufacturing according to the embodiment.
Figure 19:
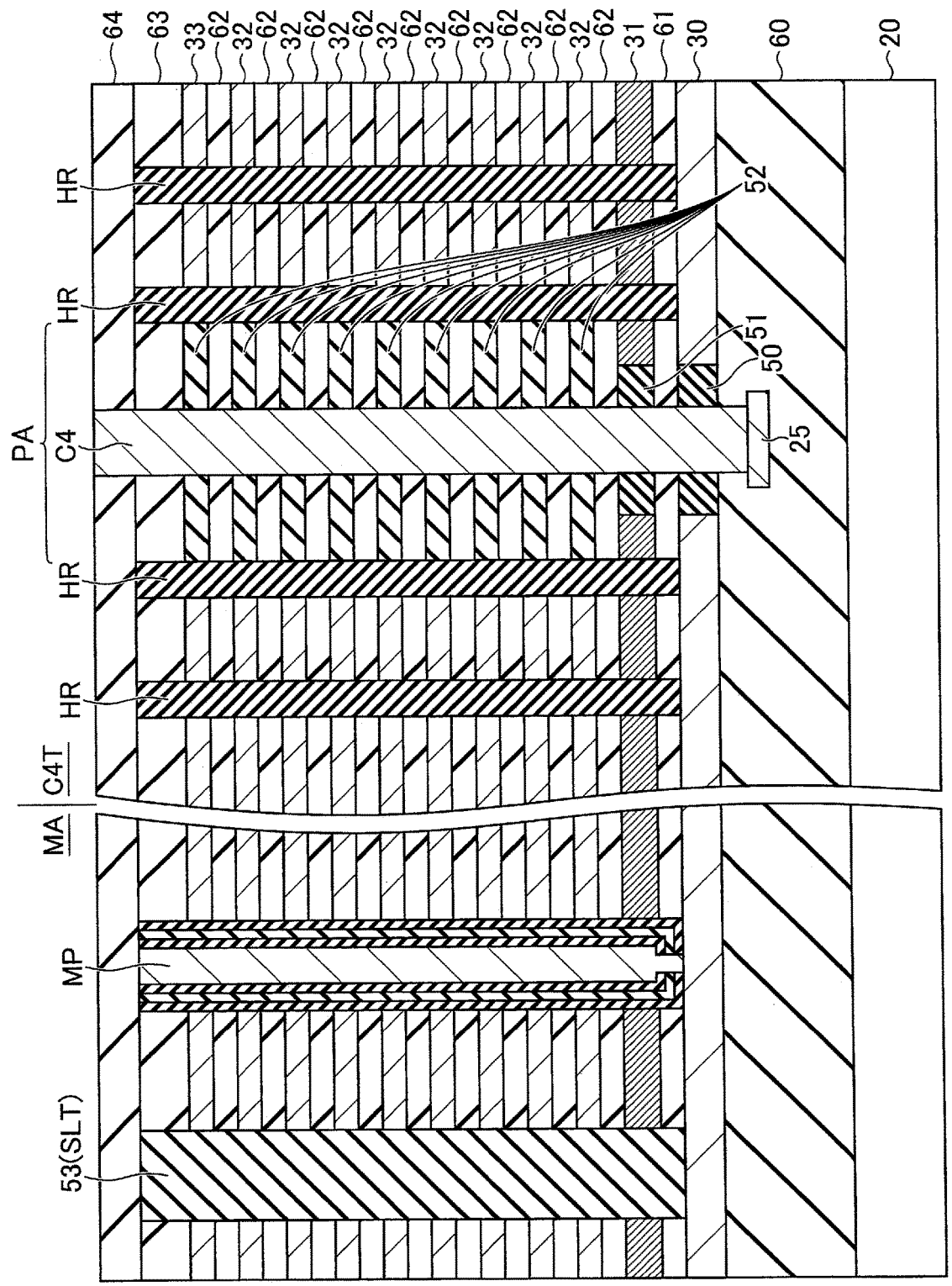
FIG. 19 is a cross-sectional diagram illustrating an example of a cross-sectional structure of the semiconductor memory device in the course of manufacturing according to the embodiment.

Subsequently, a contact C4 is formed, as shown in FIGS. 18 and 19 (step S14). Specifically, an insulating member 53 is formed in the slit SLT. In this step, a portion of the insulating member 53 formed above the insulating member 63 is removed by, for example, CMP, and the upper portions of the insulating member 53 and the insulating layer 63 are planarized. An insulating layer 64 is formed on the insulating layer 63 and the insulating member 53.

After that, a mask including an opening at a position at which a contact C4 is to be formed is formed by, for example, photolithography. A hole corresponding to the contact C4 is formed by anisotropic etching using the formed mask. The hole penetrates the insulating layers 50 and 51, the insulating layers 61 to 64, and the sacrificial members 52, and the conductive layer 25 is exposed to the lower end of the hole. Thereafter, a conductor, for example, is embedded in the hole, and thereby the contact C4 is formed.

According to the above-described manufacturing steps of the semiconductor memory device 1 of the present embodiment, the support pillars HRo, HRe, and HRd, the memory pillars MP, the source line SL, the word lines WL, and the select gate lines SGD and SGS coupled to the memory pillars MP are formed. The above-described manufacturing steps are merely an example, and another process may be inserted between the manufacturing steps. The hole corresponding to the contact C4 may be formed simultaneously with the holes corresponding to the support pillars HRo, HRe, and HRd. The hole corresponding to the contact C4 may be formed simultaneously with the holes corresponding to the memory pillars MP.

[1-3] Advantages of Embodiment

The semiconductor memory device 1 according to the above-described embodiment is capable of decreasing the degree of difficulty of the processing of the semiconductor memory device 1, thus improving yield. Hereinafter, detailed advantages of the semiconductor memory device 1 according to the embodiment will be described.

In a semiconductor memory device in which memory cells are three-dimensionally stacked, there is a case where a circuit such as a sense amplifier module is provided below a memory cell array. One way to couple a circuit below the memory cell array and an interconnect above the memory cell array in such a semiconductor memory device is to provide a contact that penetrates the memory cell array. However, use of a metal such as tungsten as a word line WL makes it difficult to process a hole in a stacked interconnect structure of the memory cell array, leading to a possible increase in the manufacturing cost.

To address this, a penetration region PA in which a sacrificial member is not replaced with a conductor may be formed in the replacement process of the stacked interconnects. The stacked structure remaining in the penetration region PA becomes a stacked structure including the sacrificial member and the insulating layer, making it easy to process a hole for forming a contact C4 in the penetration region PA. In addition, by forming the sacrificial member of an insulator, it is possible to omit formation of a spacer insulating film on a side surface of the hole, thus reducing the number of steps for forming the contact C4.

Figure 20:
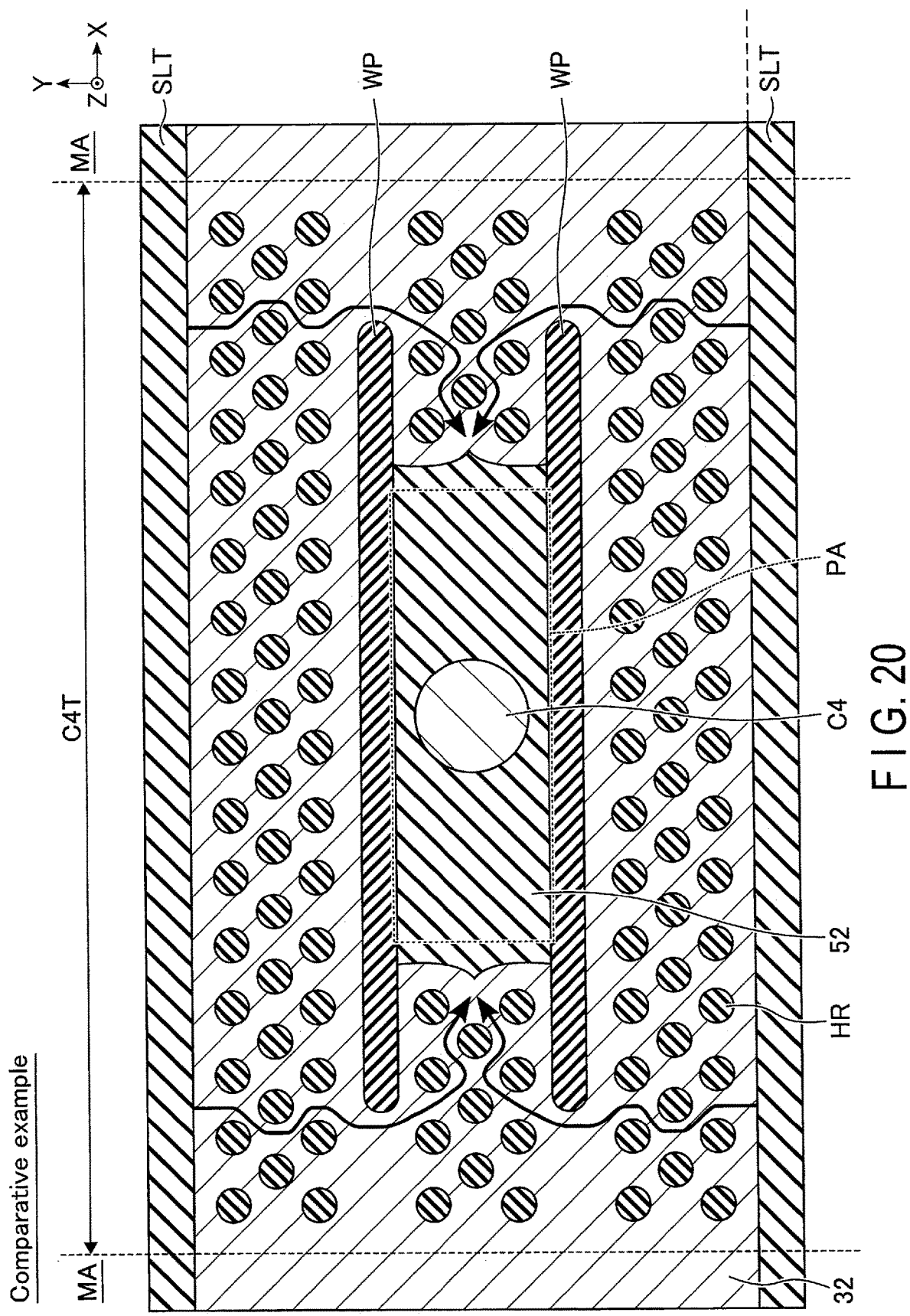
FIG. 20 is a cross-sectional diagram illustrating an example of a cross-sectional structure of the memory cell array included in the semiconductor memory device according to a comparative example of the embodiment.

Hereinafter, a method of forming a penetration region PA according to a comparative example will be described. FIG. 20 shows an example of a cross-sectional structure of a memory cell array in the semiconductor memory device according to the comparative example of the embodiment, in which a region including a contact region C4T and a penetration region PA is included. As shown in FIG. 20, the semiconductor memory device according to the comparative example includes, between adjacent slits SLT, two wall portions WP, which interpose the penetration region PA in between, and a plurality of support pillars HR. The wall portions WP, which have a configuration similar to that of the slits SLT, are provided in such a manner that two wall portions WP, each extending along the X direction, are aligned in the Y direction. The support pillars HR are provided in a staggered arrangement in a portion other than the penetration region PA.

In the replacement process of the stacked interconnects according to the comparative example, etching of the portion interposed by the adjacent wall portions WP is advanced so as to detour around end portions of adjacent wall portions WP. That is, in the replacement process, the advancement of etching toward the central region between adjacent wall portions WP is retarded. Thus, it is possible in the comparative example to form a region (penetration region PA) in which a sacrificial member remains in part of the region interposed by the wall portions WP, by stopping etching at the point in time when removal of the sacrificial member in the memory region MA has been completed. The wall portions WP may be formed either simultaneously with the support pillars HR, or simultaneously with the slits SLT.

When the wall portions WP and the slits SLT are simultaneously formed, the controllability of etching of the wall portions WP and the slits SLT, which have similar shapes, is increased. However, when an insulating material is embedded in the wall portions WP, an insulating material is embedded in the slits SLT, too. Since the replacement process of the sacrificial members 52 with the conductive layers 32 is performed via the slits SLT, the insulator embedded in the slits SLT needs to be removed prior to the replacement process. That is, in the present example, a step of embedding an insulator in the wall portions WP and removing the insulator from the slits SLT is required. The increase in the number of steps can lead to an increase in the manufacturing cost.

On the other hand, when the wall portions WP and the support pillars HR are simultaneously formed, both the wall portions WP and the support pillars HR are formed in a structure in which an insulator is embedded prior to the replacement process. Thus, the number of steps when the wall portions WP and the support pillars HR are simultaneously formed may be decreased as compared to the case where the wall portions WP and the slits SLT are simultaneously formed. However, each wall portion WP has a shape greatly extending in the X direction, and the area of its opening is greater than the area of the opening of each support pillar HR. In this manner, a difference in the opening area may be caused between the wall portions WP and the support pillars HR, thus decreasing the controllability of etching of the wall portions WP and the support pillars HR. The decrease in the controllability of etching may cause an occurrence of etching-induced defects.

The semiconductor memory device 1 according to the present embodiment includes, in the contact region C4T, a plurality of oblong support pillars HRo and HRe arranged in an alternating manner between the penetration region PA and the slit SLT. The alternate arrangement of the oblong support pillars HRo and HRe allows for formation of facing portions FP between adjacent support pillars HRo and HRe. The etching of the replacement process is advanced through a plurality of facing portions FP.

Thereby, the advancement of etching of the sacrificial members 52 in the Y direction can be retarded in the contact region C4T. Specifically, it is possible to remove the sacrificial member of the memory region MA, and to maintain a desired breadth of the sacrificial member in the penetration region PA. That is, the semiconductor memory device 1 according to the present embodiment is capable of forming a penetration region PA, as compared to the case where the wall portions WP are provided in the comparative example.

Moreover, the lengths of the support pillars HRo and HRe formed in the present embodiment can be decreased to as short as, for example, 1/10 of the lengths of the wall portions WP in the comparative example. The support pillars HRo and HRe, the length of which extending in the X direction is shorter than that of the wall portions WP, have a smaller difference in the area of opening from the support pillars HRd. Accordingly, the semiconductor memory device 1 according to the present embodiment provides improved controllability of etching as compared to the case where the wall portions WP and the support pillars HR are simultaneously formed in the comparative example, allowing for suppression of the occurrence of etching-induced defects.

Furthermore, in the semiconductor memory device 1 according to the present embodiment, the oblong support pillars HRo and HRe and the dot-shaped support pillars HRd are formed together, after which the slits SLT are formed and the replacement process is performed. Thus, the semiconductor memory device 1 according to the present embodiment is capable of suppressing an increase in the number of steps, as in the case where the wall portions WP and the support pillars HR are simultaneously formed in the comparative example, allowing for a reduction in the manufacturing cost.

[2] Other Modifications, Etc.

Figure 21:
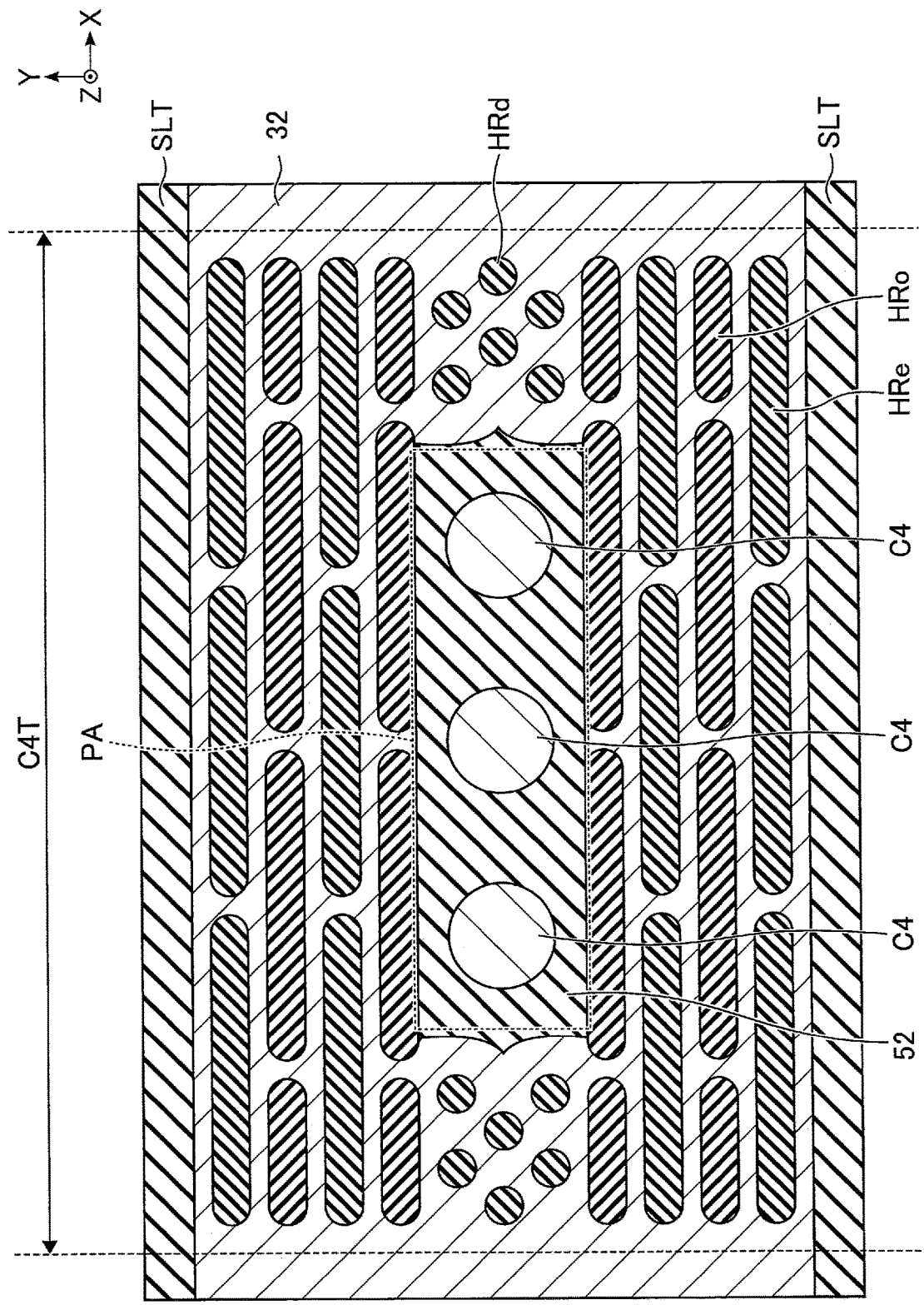
FIG. 21 is a cross-sectional diagram illustrating an example of a cross-sectional structure of the memory cell array included in the semiconductor memory device according a modification of the embodiment.

In the present embodiment, a case has been described, as an example, where a single contact C4 is arranged in a penetration region PA; however, a plurality of contacts C4 may be arranged in the penetration region PA. FIG. 21 illustrates an example of a cross-sectional structure of a memory cell array included in the semiconductor memory device 1 according to a modification of the present embodiment. As illustrated in FIG. 21, the contact region C4T according to the modification is provided so as to be wider in area than the present embodiment. In addition, the oblong support pillars HRo and HRe, which are arranged in an alternating manner, are provided in a wider region than the present embodiment.

As described in the embodiment, the support pillars HRo and HRe, which are arranged in an alternating manner, are capable of retarding the advancement of etching of the sacrificial members 52 in the Y direction. The size of the penetration region PA in the X direction is determined by the amount of etching in the path that detours around an end portion of the contact region C4T. That is, the size of the penetration region PA may be freely designed according to the shape and arrangement of the support pillars HRo and HRe. In the modification, since the support pillars HRo and HRe are provided in a wider region than the present embodiment in the X direction, the penetration region PA is provided in a wider region than the present embodiment in the X direction. Thus, it is possible in the modification to align a plurality of contacts C4 along the X direction in the penetration region PA.

In the present embodiment, a case has been described where a contact C4 is not adjacent to a gap portion GP; however, a contact C4 may be adjacent to a gap portion GP, as in the modification. In addition, the oblong support pillars HRo and HRe in the contact region C4T may be designed as any shape or arrangement that allows for formation of the penetration region PA. For example, if the sum of the lengths of the facing portions FP in the bypass region BR is designed to be at least equal to or greater than half the width W3 of the penetration region PA (middle region MR) in the Y direction, the number of oblong support pillars HR in the bypass region BR can be designed to be any number. In addition, the arrangement of the support pillars HR is not limited to the arrangement in which the odd-numbered support pillars HRo and the even-numbered support pillars HRe are arranged in an alternating manner; for example, a number of oblong support pillars HR may be arranged in a matrix pattern in the bypass region BR, with support pillars HR in the n-th row and the (n+1)-th row (where n is an integer not less than one), counting from the side of the penetration region PA, being shifted in the X direction, in such a manner that the support pillars HR include portions facing each other in the Y direction.

In the present embodiment, the shapes of the support pillars HRo and HRe arranged in the vicinity of the boundary between the contact region C4T and the memory region MA may be different from the shapes of the other support pillars HRo and HRe. For example, the support pillars HRo and HRe arranged in the vicinity of the boundary between the contact region C4T and the memory region MA may be formed in such a manner that their end portions are aligned, as shown in FIG. 7.

The shapes of the support pillars HRo and HRe arranged in the vicinity of the boundary between the contact region C4T and the memory region MA may be similar to the shapes of the other support pillars HRo and HRe. That is, the end portions of the support pillars HRo and HRe need not be aligned in the vicinity of the boundary between the contact region C4T and the memory region MA. In other words, the end portions of the support pillars HRo and the end portions of the support pillars HRe may be arranged in an alternating manner in the vicinity of the boundary between the contact region C4T and the memory region MA.

In the present embodiment, the configuration of the memory cell array 10 may be different from the above-described configuration. For example, the memory pillar MP may be configured in such a manner that two or more pillars are coupled in the Z direction. Alternatively, the memory pillar MP may be configured in such a manner that a pillar corresponding to the select gate line SGD and a pillar corresponding to a word line WL are connected. Multiple types of insulators may be provided in the slit SLT. The number of bit lines BL overlapping each memory pillar MP may be designed to be any number.

A case has been described, as an example, where the end portions of the word lines WL0 to WL7 in the hookup region HA are formed in a staircase shape with three-layer steps, including two steps in the Y direction and a plurality of steps in the X direction; however, the structure is not limited thereto. The number of steps formed in the Y direction at end portions of the stacked word lines WL may be designed to be any number. That is, the end portions of the word lines WL in the hookup region HA in the semiconductor memory device 1 may be designed as a staircase shape with steps of any number of layers.

In the drawings used for illustration in the present embodiment, a case is illustrated, as an example, where the support pillars HR and the contacts C4 have an equal diameter in the Z direction; however, the configuration is not limited thereto. For example, the support pillars HR and the contacts C4 may have a tapered or inverse-tapered shape, or may have a shape that bulges at the middle. Similarly, the slits SLT may have a tapered or inverse-tapered shape, or may have a shape that bulges at the middle. In the above-described embodiment, a case has been described, as an example, where each of the support pillar HR, the contacts C4, and the memory pillars MP has a circular cross-sectional structure; however, the shape of the cross-sectional structure may be oval, or designed as any other shape.

Herein, the term "couple" refers to electrical coupling, and does not exclude interposition of another component. The expression "electrically coupled" covers insulator-interposed coupling that allows for the same operation as electrical coupling without an insulator. The term "pillar" refers to a structure provided in a hole formed in the process of manufacturing the semiconductor memory device 1. Expressions such as "substantially same length" and "substantially line-symmetric" allow for errors caused by manufacturing variations.

While certain embodiments have been described, these embodiments have been presented by way of example only, and are not intended to limit the scope of the inventions. Indeed, the novel embodiments described herein may be embodied in a variety of other forms; furthermore, various omissions, substitutions, and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device, comprising:
    a substrate which includes a first region and a second region, the first region including a memory cell transistor, the second region being adjacent to the first region in a first direction and including first to third subregions aligned in a second direction intersecting the first direction;
    a first insulating member and a second insulating member each being provided across the first region and the second region along the first direction, and including a portion that interposes the first to third subregions in the second direction;
    a first conductive layer provided in a first layer above the substrate so as to extend along the first direction across the first region and the second region between the first insulating member and the second insulating member;
    a plurality of first pillars provided in the first region so as to penetrate the first conductive layer;
    a first insulating layer provided in the first layer in the second subregion, and surrounded by a portion of the first conductive layer that extends in the first layer across the second region;
    a first contact provided so as to penetrate the first insulating layer;
    a plurality of first members each including a portion extending along the first direction, and provided so as to penetrate the first conductive layer in the first subregion; and
    a plurality of second members each including a portion extending along the first direction, and provided so as to penetrate the first conductive layer in the third subregion, wherein
    both the first members and the second members are arranged in such a manner that the first members and the second members aligned in the second direction in an n-th row and an (n+1)-th row, counted from a side of the second subregion, are shifted in the first direction, where n is an integer not less than one, and
    both the first members adjacent to each other in the second direction and the second members adjacent to each other in the second direction are arranged in such a manner that portions extending in the first direction face each other.

2. The semiconductor memory device according to claim 1, wherein
    the first members and the second members aligned in the second direction in odd-numbered rows and even-numbered rows, counted from the side of the second subregion, are arranged in an alternating manner.

3. The semiconductor memory device according to claim 1, wherein the first subregion includes a plurality of first facing portions which are faced by portions included in the first members adjacent to each other in the second direction and extending in the first direction,
the third subregion includes a plurality of second facing portions which are faced by portions included in the second members adjacent to each other in the second direction and extending in the first direction,
a sum of lengths of the first facing portions in the first direction, included in a shortest path leading from the first insulating member, passing through a region in which the first members are arranged, bypassing the first members, and arriving at the second subregion, is equal to or greater than half a width of the second subregion in the second direction, and
a sum of lengths of the second facing portions in the first direction, included in a shortest path leading from the second insulating member, passing through a region in which the second members are arranged, bypassing the second members, and arriving at the second subregion, is equal to or greater than half the width of the second subregion in the second direction.

4. The semiconductor memory device according to claim 1, wherein
a shortest path leading from the first insulating member, passing through a region in which the first members are arranged in the first subregion, bypassing the first members, and arriving at the second subregion is longer than a shortest path leading from the first insulating member, passing through a region in which the first pillars are arranged in the first region, bypassing the first pillars, and arriving at an intermediate position between the first insulating member and the second insulating member in the second direction.

5. The semiconductor memory device according to claim 1, wherein
the first members include, in the n-th row or the (n+1)-th row, two first members adjacent to each other in the first direction and arranged in such a manner that a portion positioned between the two adjacent first members is aligned with the first contact in the second direction.

6. The semiconductor memory device according to claim 1, wherein
a shortest path leading from the first insulating member, passing through a region in which the first members are arranged in the first subregion, bypassing the first members, and arriving at the second subregion is substantially equal to a shortest path leading from the second insulating member, passing through a region in which the second members are arranged in the third subregion, bypassing the second members, and arriving at the second subregion.

7. The semiconductor memory device according to claim 1, wherein
the first members and the second members are arranged so as to be line-symmetric with respect to the second subregion.

8. The semiconductor memory device according to claim 1, further comprising:
a second contact provided adjacent to the first contact in the first direction so as to penetrate the first insulating layer.

9. The semiconductor memory device according to claim 1, further comprising:
a second conductive layer provided in a second layer different from the first conductive layer so as to extend along the first direction across the first region and the second region between the first insulating member and the second insulating member; and
a second insulating layer provided in the second layer in the second subregion, and surrounded by a portion of the second conductive layer that extends in the second layer across the second region, wherein
the first pillars are provided so as to further penetrate the second conductive layer in the first region, and
the first contact is provided so as to further penetrate the second insulating layer.

10. The semiconductor memory device according to claim 9, further comprising:
a third conductive layer provided in a third layer different from the first conductive layer and the second conductive layer, formed along a plane including the first direction and the second direction, and having a length greater than lengths of the first conductive layer and the second conductive layer in the second direction, wherein
lower ends of the first pillars are in contact with the third conductive layer in the first region, and
the first contact is provided so as to further penetrate the third insulating layer.

11. The semiconductor memory device according to claim 10, wherein
lower ends of the first members and the second members are in contact with the third conductive layer in the second region.

12. The semiconductor memory device according to claim 10, wherein
lower ends of the first insulating member and the second insulating member are in contact with the third conductive layer.

13. The semiconductor memory device according to claim 1, wherein
portions at which the first conductive layer and the first pillars intersect function as memory cell transistors.

14. The semiconductor memory device according to claim 13, further comprising:
a plurality of second pillars provided so as to penetrate the first conductive layer in a third region of the substrate, wherein
the second region is provided between the first region and the third region of the substrate in the first direction, and
portions at which the first conductive layer and the second pillars intersect function as other memory cell transistors.

15. The semiconductor memory device according to claim 1, further comprising:
a plurality of third members provided in the second subregion so as to penetrate the first conductive layer.

16. The semiconductor memory device according to claim 15, wherein
the third members have a shape different from shapes of the first members and the second members, and do not include portions extending along the first direction.

* * * * *